US012567610B2

(12) United States Patent
Budan et al.

(10) Patent No.: US 12,567,610 B2
(45) Date of Patent: **\*Mar. 3, 2026**

(54) SYSTEMS AND METHODS FOR PREDICTING REMAINING USEFUL LIFE IN BATTERIES AND ASSETS

(71) Applicant: EATRON TECHNOLOGIES LIMITED, Warwick (GB)

(72) Inventors: Gokhan Budan, Kidlington (GB); Anil Ozturk, Istanbul (TR); Alex Darlington, Leamington Spa (GB); Can Kurtulus, Istanbul (TR)

(73) Assignee: Eatron Technologies Limited, Warwick (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/064,659

(22) Filed: Dec. 12, 2022

(65) Prior Publication Data

US 2023/0307731 A1 Sep. 28, 2023

Related U.S. Application Data

(63) Continuation of application No. 17/706,172, filed on Mar. 28, 2022, now Pat. No. 11,527,786.

(51) Int. Cl.
*H01M 10/48* (2006.01)
*B60L 58/16* (2019.01)
(Continued)

(52) U.S. Cl.
CPC ........... *H01M 10/482* (2013.01); *B60L 58/16* (2019.02); *G01R 31/367* (2019.01);
(Continued)

(58) Field of Classification Search
CPC ............. H01M 10/482; H01M 10/486; H01M 2220/20; B60L 58/16; B60L 2240/545;
(Continued)

(56) References Cited

U.S. PATENT DOCUMENTS 7,928,735 B2 4/2011 Huang
9,381,825 B2 7/2016 Li
(Continued)

FOREIGN PATENT DOCUMENTS

CN 102259644 A * 11/2011 ............. B60K 6/445
CN 103926536 A * 7/2014 ............. G01R 31/36
WO 2019/017991 A1 1/2019

OTHER PUBLICATIONS

Amit Adhikaree, Cloud-Based Battery Condition Monitoring Platform for Large-Scale Lithium-Ion Battery Energy Storage Systems Using Internet-of-Things (IoT), © 2017 IEEE, pp. 1004-1009 (Year: 2017).

(Continued)

*Primary Examiner* — Tung S Lau
(74) *Attorney, Agent, or Firm* — Dickinson Wright PLLC; Jonathan H. Harder

(57) ABSTRACT

In one aspect, a method comprises receiving first data pertaining to a battery pack of a vehicle, wherein the first data is received from sensors associated with the vehicle, and the first data pertains to a battery pack current, a cell voltage, a cell current, a cell temperature, or some combination thereof; predicting a remaining useful life of the battery pack of the vehicle by using a hybrid model comprising a physics-based model that receives the first and generates properties pertaining to the battery pack; a machine learning model that uses the properties to predict the remaining useful life of each cell of the battery pack; and transmitting the remaining useful life for presentation.

20 Claims, 21 Drawing Sheets

(51) Int. Cl.

| | |
|---|---|
| *G01R 31/367* | (2019.01) |
| *G01R 31/3842* | (2019.01) |
| *G01R 31/392* | (2019.01) |
| *G01R 31/396* | (2019.01) |
| *G07C 5/04* | (2006.01) |

(52) U.S. Cl.
CPC ....... *G01R 31/3842* (2019.01); *G01R 31/392* (2019.01); *G01R 31/396* (2019.01); *G07C 5/04* (2013.01); *H01M 10/486* (2013.01); *B60L 2240/545* (2013.01); *B60L 2240/547* (2013.01); *B60L 2240/549* (2013.01); *H01M 2220/20* (2013.01)

(58) Field of Classification Search
CPC ......... B60L 2240/547; B60L 2240/549; B60L 2240/70; B60L 3/12; B60L 58/12; B60L 2260/44; B60L 2260/46; G01R 31/367; G01R 31/3842; G01R 31/392; G01R 31/396; G07C 5/04; Y02E 60/10
See application file for complete search history.

(56) References Cited

U.S. PATENT DOCUMENTS

| | | | | |
|---|---|---|---|---|
| 9,446,678 | B2 | 9/2016 | Meyer | |
| 10,436,848 | B2 | 10/2019 | Li | |
| 10,969,436 | B1 | 4/2021 | Sarwat | |
| 11,243,262 | B2 * | 2/2022 | Ukumori | H02J 7/00 |
| 11,340,308 | B1 | 5/2022 | Schreiber | |
| 11,529,887 | B2 | 12/2022 | Herring | |
| 2009/0027056 | A1 | 1/2009 | Huang | |
| 2012/0101755 | A1 * | 4/2012 | Hirasawa | B60L 53/11 |
| | | | | 702/63 |

| | | | | |
|---|---|---|---|---|
| 2015/0191100 | A1 | 7/2015 | Schindler | |
| 2015/0231982 | A1 | 8/2015 | Li | |
| 2015/0231986 | A1 | 8/2015 | Li | |
| 2015/0232083 | A1 | 8/2015 | Yu | |
| 2015/0239365 | A1 * | 8/2015 | Hyde | B60L 58/26 |
| | | | | 701/2 |
| 2017/0117725 | A1 | 4/2017 | Hendricks | |
| 2018/0143257 | A1 | 5/2018 | Garcia | |
| 2018/0201151 | A1 | 7/2018 | Dudar | |
| 2018/0238698 | A1 | 8/2018 | Pedersen | |
| 2018/0340983 | A1 | 11/2018 | Li | |
| 2018/0345811 | A1 | 12/2018 | Michels | |
| 2019/0113577 | A1 | 4/2019 | Severson | |
| 2019/0251759 | A1 | 8/2019 | Lora | |
| 2020/0081070 | A1 * | 3/2020 | Chemali | G06N 3/044 |
| 2020/0164763 | A1 | 5/2020 | Holme | |
| 2021/0231450 | A1 | 7/2021 | Pedersen | |
| 2022/0067667 | A1 | 3/2022 | Mahipal | |
| 2022/0108262 | A1 * | 4/2022 | Cella | G05B 17/02 |
| 2022/0111759 | A1 | 4/2022 | Ijas | |
| 2022/0153166 | A1 | 5/2022 | Rangel | |
| 2022/0252670 | A1 | 8/2022 | Xu | |
| 2022/0294027 | A1 | 9/2022 | Choudhary | |

OTHER PUBLICATIONS

Amani Nasser Almutlaq, Auto-Scaling Approach for Cloud based Mobile Learning Applications, (IJACSA) International Journal of Advanced Computer Science and Applications, vol. 10, No. 1, 2019 (Year: 2019).

Adnan Nuhic, Health diagnosis and remaining useful life prognostics of lithium-ion batteries using data-driven method, Available online Dec. 13, 2012 (Year: 2012).

ISRWO, PCT/EP2022/074102, mailed Dec. 20, 2022.

\* cited by examiner

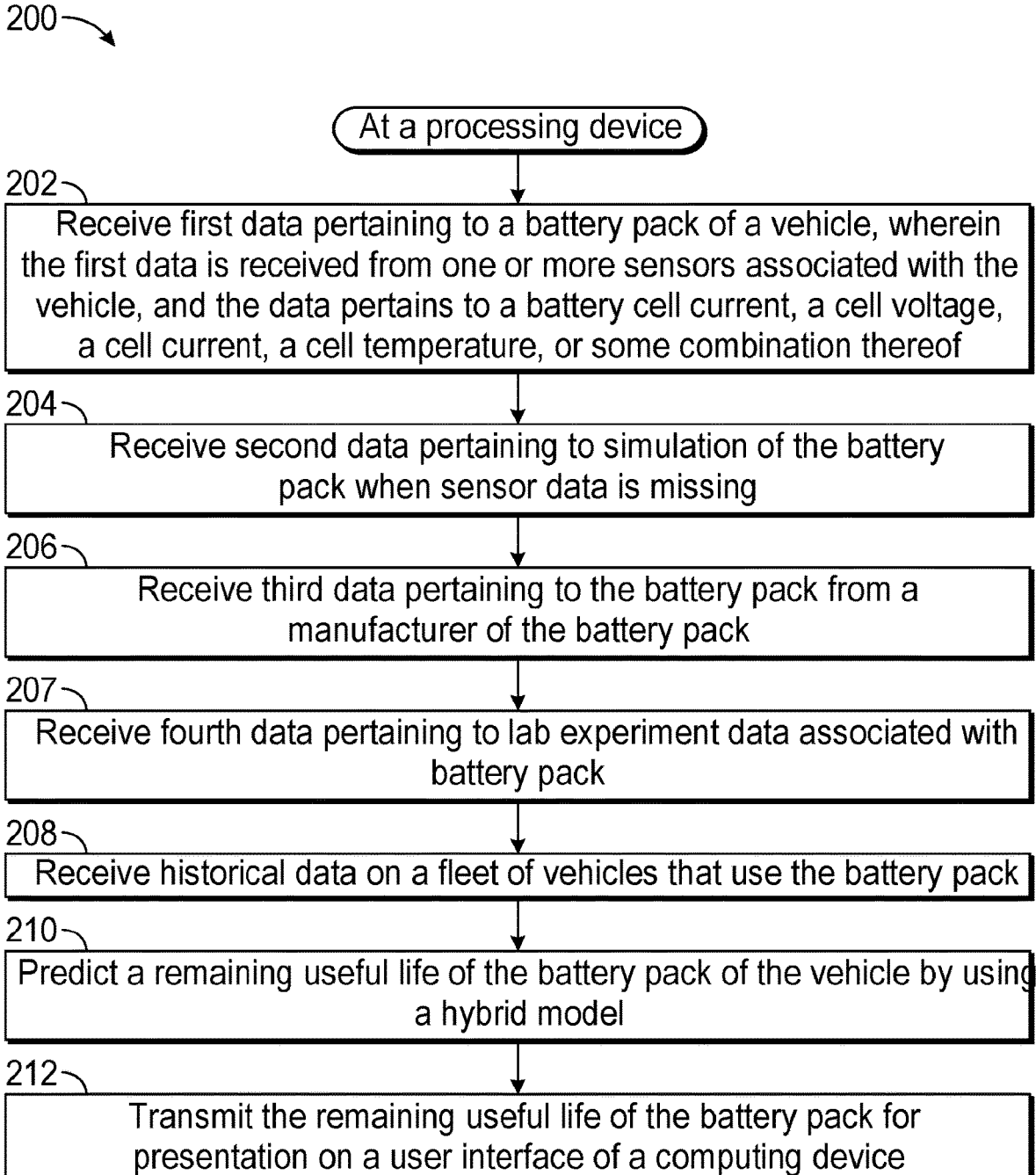

200

At a processing device

202

Receive first data pertaining to a battery pack of a vehicle, wherein the first data is received from one or more sensors associated with the vehicle, and the data pertains to a battery cell current, a cell voltage, a cell current, a cell temperature, or some combination thereof

204

Receive second data pertaining to simulation of the battery pack when sensor data is missing

206

Receive third data pertaining to the battery pack from a manufacturer of the battery pack

207

Receive fourth data pertaining to lab experiment data associated with battery pack

208

Receive historical data on a fleet of vehicles that use the battery pack

210

Predict a remaining useful life of the battery pack of the vehicle by using a hybrid model

212

Transmit the remaining useful life of the battery pack for presentation on a user interface of a computing device

FIG. 2

300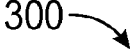

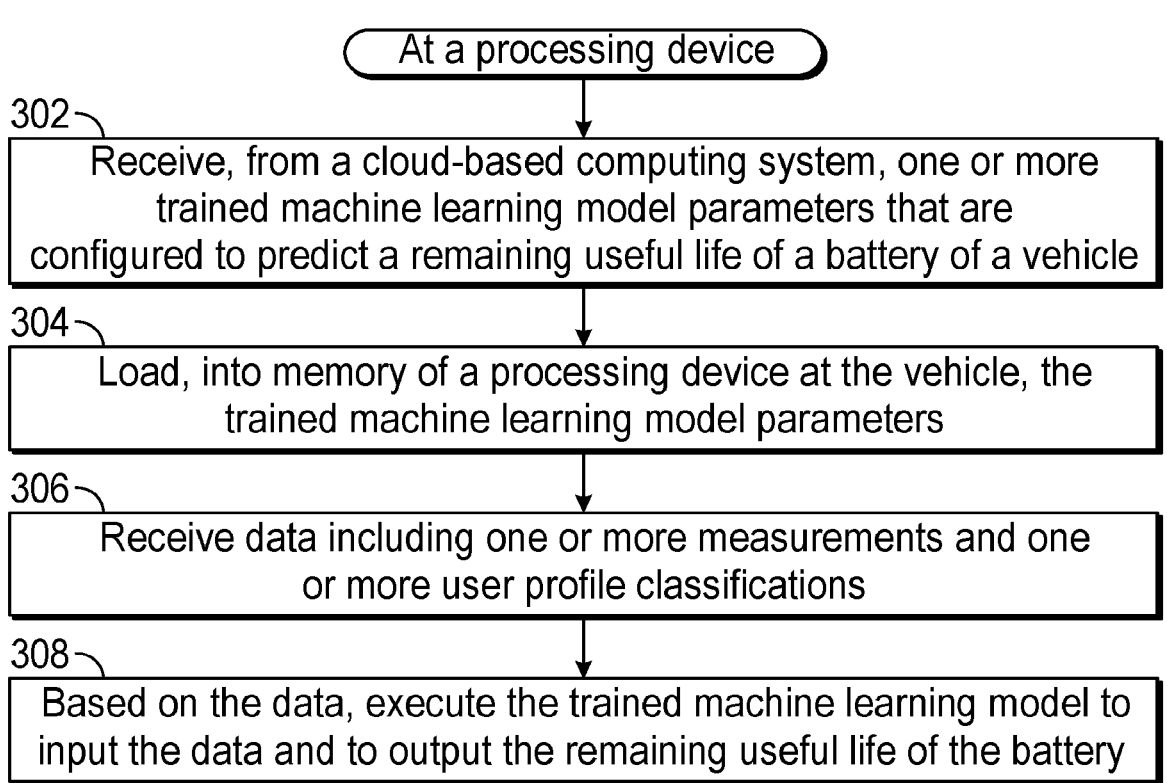

At a processing device

302
Receive, from a cloud-based computing system, one or more trained machine learning model parameters that are configured to predict a remaining useful life of a battery of a vehicle 304
Load, into memory of a processing device at the vehicle, the trained machine learning model parameters 306
Receive data including one or more measurements and one or more user profile classifications 308
Based on the data, execute the trained machine learning model to input the data and to output the remaining useful life of the battery

FIG. 3

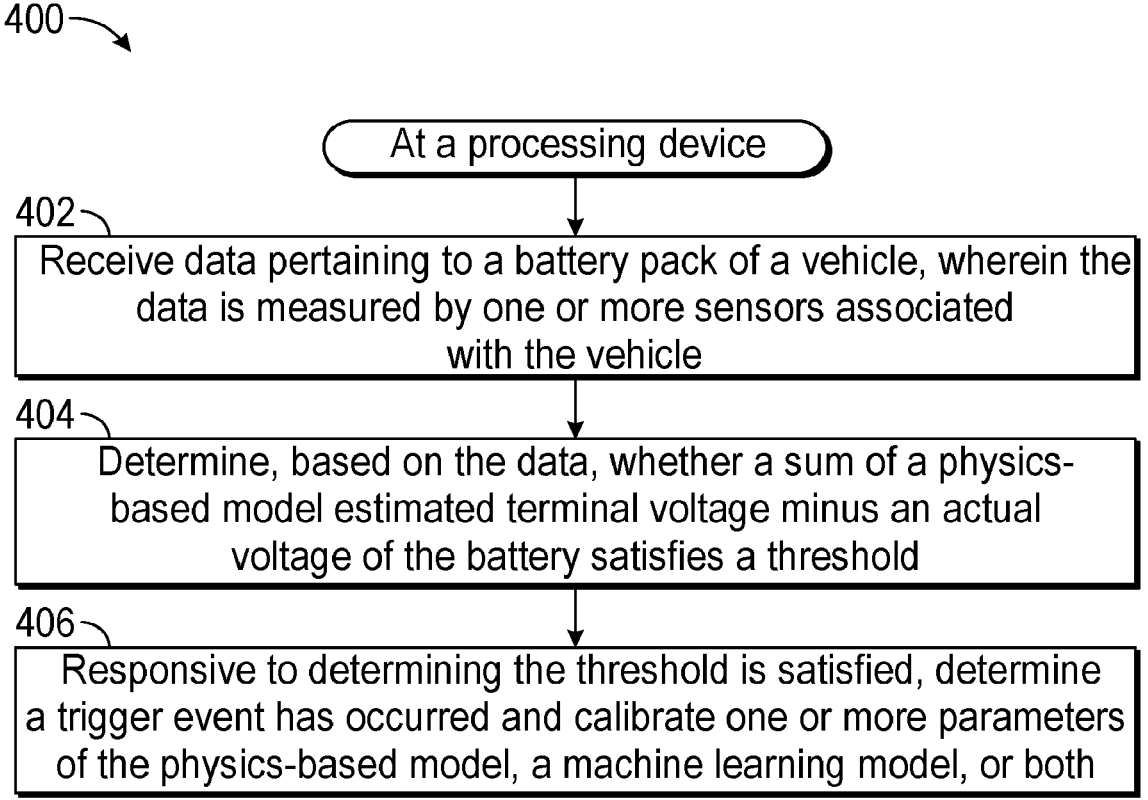

400

At a processing device

402

Receive data pertaining to a battery pack of a vehicle, wherein the data is measured by one or more sensors associated with the vehicle

404

Determine, based on the data, whether a sum of a physics-based model estimated terminal voltage minus an actual voltage of the battery satisfies a threshold

406

Responsive to determining the threshold is satisfied, determine a trigger event has occurred and calibrate one or more parameters of the physics-based model, a machine learning model, or both

FIG. 4

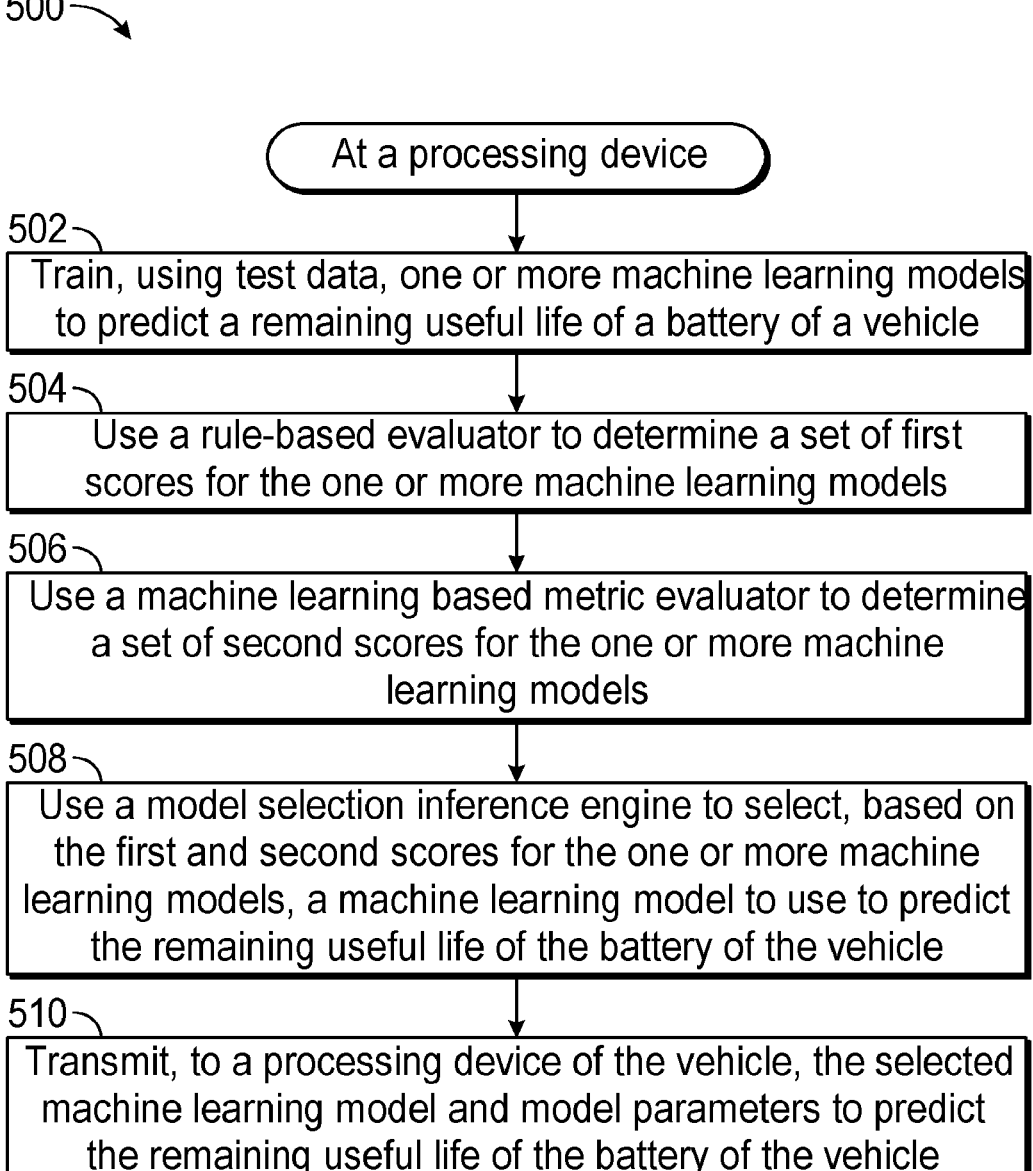

500

At a processing device

502
Train, using test data, one or more machine learning models to predict a remaining useful life of a battery of a vehicle 504
Use a rule-based evaluator to determine a set of first scores for the one or more machine learning models 506
Use a machine learning based metric evaluator to determine a set of second scores for the one or more machine learning models 508
Use a model selection inference engine to select, based on the first and second scores for the one or more machine learning models, a machine learning model to use to predict the remaining useful life of the battery of the vehicle 510
Transmit, to a processing device of the vehicle, the selected machine learning model and model parameters to predict the remaining useful life of the battery of the vehicle

FIG. 5

Acc. = Accumulated
Historical Data is Accumulated at Each Time Step and Statistics Applied as Shown in the Pipeline

SYSTEMS AND METHODS FOR PREDICTING REMAINING USEFUL LIFE IN BATTERIES AND ASSETS

CROSS-REFERENCES TO RELATED APPLICATIONS

This application is a continuation of U.S. application patent Ser. No. 17/706,172 filed Mar. 28, 2022, titled "SYSTEMS AND METHODS FOR PREDICTING REMAINING USEFUL LIFE IN BATTERIES AND ASSETS," the entire disclosure of which is hereby incorporated by reference for all purposes.

TECHNICAL FIELD

This disclosure relates generally to assets and batteries. More specifically, this disclosure relates to systems and methods for predicting remaining useful life in batteries and assets.

BACKGROUND

Many industries involve assets that age and reach End of Life (EOL) states where they are no longer useful. One such example includes energy storage solutions that are prevalent in many assets including personal laptops, mobile phones, electronic watches, rings, and other wearable devices. Further, assets including gate valves used in nuclear reactor control systems, turbofan engines, solid state disks, and other industrial applications are valuable and have limited useful lifetimes. Each asset and/or battery may be prone to degradation issues.

In one example, among various energy storage solutions, Lithium-ion (Li-ion) batteries are widely regarded as promising candidates for various applications due to their advantages of high energy density and low self-discharge. However, the life span of Li-ion batteries is not unlimited, and the cost and aging of Li-ion batteries may be two main factors hindering their development. The performance of Li-ion batteries degrades with time (calendar aging) and use (cycle aging), which is referred to as the aging phenomenon. The aging of the battery may increase operating costs, reduce the service life of the equipment, and affect the safe operation of the equipment.

Moreover, there may not be an ideal solution for recycling of Li-ion batteries. Predictive maintenance may enable mechanisms to be in place for handling of batteries before they reach their EOL reducing demands on recycling. Additionally, premature failures of the batteries may increase demands on re-cycling. Generally, when battery capacity drops below a target threshold i.e. 70-80% of initial battery capacity for an automotive-grade battery, the battery may have reached the end of its service life. The target threshold may vary between different applications.

A remaining useful life (RUL) may be referred to as an amount (e.g., number of full cycles left before a battery pack reaches an end of life state, an amount of time left before a battery pack reaches an end of life state, etc.) at which equipment performance of a battery satisfies (e.g., decreases to) a failure threshold. The RUL may represent a period (e.g., minutes, hours, days, weeks, months, years, etc.) from a Beginning of Life (BOL) observation to the EOL. EOL may refer to an amount of time that a number of charge-discharge cycles reach a replacement threshold. In other words, when battery characteristic parameters reach the replacement threshold.

SUMMARY

In one aspect, a computer-implemented method for a processing device included in a vehicle, wherein the computer-implemented method comprises: receiving first data pertaining to a battery pack of a vehicle, wherein the first data is received from one or more sensors associated with the vehicle, and the first data pertains to a battery pack current, a cell voltage, a cell current, a cell temperature, or some combination thereof; receiving second data pertaining to simulation of the battery pack when sensor data is missing; receiving third data pertaining to the battery pack from a manufacturer of the battery pack; receiving historical data on a fleet of vehicles that use the battery pack; receiving fourth data pertaining to lab experiments data associated with the battery pack; predicting, based on the first, second, third, fourth, and historical data, a remaining useful life of each cell of the battery pack of the vehicle by using a hybrid model, wherein the hybrid model comprises: a physics-based model configured to receive the data, and to generate one or more properties pertaining to the battery pack of the vehicle; a machine learning model configured to use at least the one or more properties to predict the remaining useful life of each cell of the battery pack; and transmitting the remaining useful life of each cell of the battery pack for presentation on a user interface of a computing device or to be further processed by another computer device.

In one aspect, a computer-implemented method comprises: receiving, from a cloud-based computing system, one or more machine learning model parameters that are configured to enable predicting a remaining useful life of a battery of a vehicle; loading, into memory of a processing device at the vehicle, the one or more machine learning model parameters; receiving data comprising one or more measurements and one or more user battery usage profile classifications; and based on the data, executing a trained machine learning model with the one or more parameters to input the data and to output and/or to transmit the remaining useful life of each cell the battery.

In one aspect, a computer-implemented method for a cloud-based computing system, wherein the computer-implemented method comprises: receiving data pertaining to a battery pack of a vehicle, wherein the data is measured by one or more sensors associated with the vehicle; determining, based on the data, whether a sum of a physics-based model estimated terminal voltage minus an actual voltage of the battery pack satisfies a threshold; and responsive to determining the threshold is satisfied, determining a trigger event has occurred and calibrate one or more parameters of the physics-based model, a machine learning model, or both, wherein the physics-based model outputs one or more properties pertaining to the battery pack of the vehicle, and the machine learning model uses the one or more properties to predict a remaining useful life of each cell of the battery pack.

In one aspect, a computer-implemented method for a cloud-based computing system, wherein the computer-implemented method comprises: training, using test data, one or more machine learning models to predict a remaining useful life of a battery of a vehicle; using a rule-based evaluator to determine a plurality of first scores for the one or more machine learning models; using a machine learning based metric evaluator to determine a plurality of second scores for the one or more machine learning models; using a model selection inference engine to select, based on the first and second scores for the one or more machine learning models, a machine learning model to use to predict the remaining useful life of each cell of the battery of the vehicle; and transmitting, to a processing device of the vehicle, the selected machine learning model and parameters to predict the remaining useful life of each cell of the battery of the vehicle.

In another aspect, a tangible, non-transitory computer-readable medium may store instructions and a processing device may execute the instructions to perform one or more operations of any method disclosed herein.

In another aspect, a method may include one or more operations implemented by computer instructions and performed by one or more processing devices to perform the techniques disclosed herein.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, independent of whether those elements are in physical contact with one another. The terms "transmit," "receive," and "communicate," as well as derivatives thereof, encompass both direct and indirect communication. The terms "transmit," "receive," and "communicate," as well as derivatives thereof, encompass both communication with remote systems and communication within a system, including reading and writing to different portions of a memory device. The terms "include" and "comprise," as well as derivatives thereof, mean inclusion without limitation. The term "or" is inclusive, meaning or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "translate" may refer to any operation performed wherein data is input in one format, representation, language (computer, purpose-specific, such as drug design or integrated circuit design), structure, appearance or other written, oral or representable instantiation and data is output in a different format, representation, language (computer, purpose-specific, such as drug design or integrated circuit design), structure, appearance or other written, oral or representable instantiation, wherein the data output has a similar or identical meaning, semantically or otherwise, to the data input. Translation as a process includes but is not limited to substitution (including macro substitution), encryption, hashing, encoding, decoding or other mathematical or other operations performed on the input data. The same means of translation performed on the same input data will consistently yield the same output data, while a different means of translation performed on the same input data may yield different output data which nevertheless preserves all or part of the meaning or function of the input data, for a given purpose. Notwithstanding the foregoing, in a mathematically degenerate case, a translation can output data identical to the input data. The term "controller" means any device, system or part thereof that controls at least one operation. Such a controller may be implemented in hardware or a combination of hardware and software or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable storage medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable storage medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable storage medium excludes wired, wireless, optical, or other communication links that transport transitory electrical or other signals. A non-transitory computer readable storage medium includes media where data can be permanently stored and media where data can be stored and later overwritten, such as a rewritable optical disc or an erasable memory device.

The term "user profile" refers to a "user battery usage profile" throughout this disclosure.

The terms "user battery usage profile" and "user profile classification" may be used interchangeably herein.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which:

FIG. 2 illustrates example operations of a method for using a hybrid model to predict a remaining useful life of a battery according to certain embodiments of this disclosure;

FIG. 3 illustrates example operations of a method for using a trained machine learning model at a vehicle to predict a remaining useful life according to certain embodiments of this disclosure;

FIG. 4 illustrates example operations of a method for calibrating a machine learning model based on whether a trigger event has occurred according to certain embodiments of this disclosure;

FIG. 5 illustrates example operations of a method for using a model selection inference engine to select, based on first and second scores for one or more machine learning models, a machine learning model to use to predict the remaining useful life of each cell of the battery pack according to certain embodiments of this disclosure;

DETAILED DESCRIPTION

Figure 1:
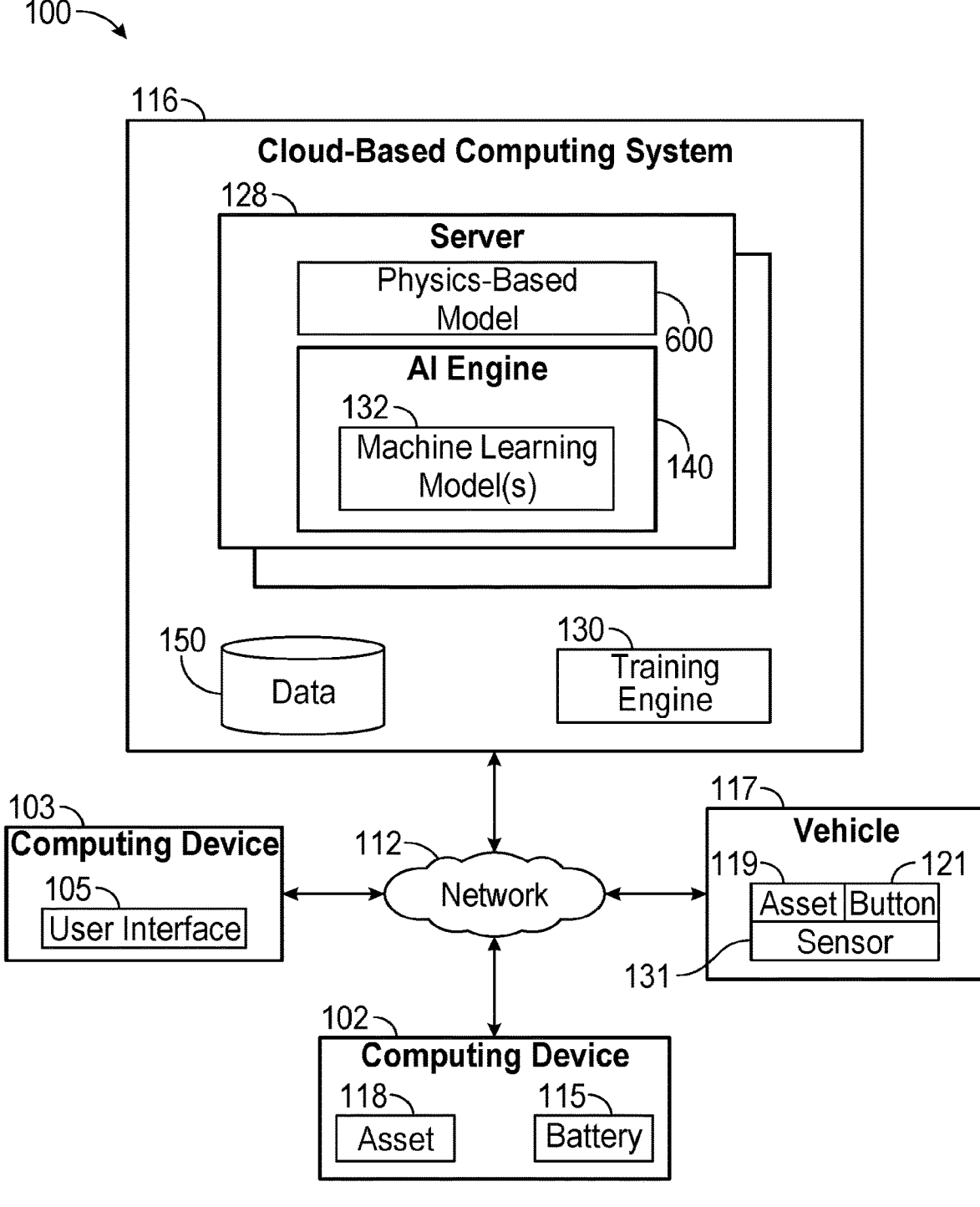
FIG. 1 illustrates a high-level component diagram of an illustrative system architecture according to certain embodiments of this disclosure.

Remaining useful life (RUL) may be a strong indicating parameter in determining current value of an asset, RUL may also play a role in maintenance and servicing of assets, and RUL and degradation in batteries may be an implicit state quantity that may not be directly measured. The majority of the description refers to a battery but a battery should be understood to be a species of a genus "asset". Other assets may include personal laptops, any electrochemical application, a personal laptop, a mobile phone, an electronic watch, a ring, other wearable computing devices, gate valves used in the nuclear reactor control systems, turbofan engines, solid state disks, and assets in many other industries.

Battery degradation is a complex process controlled by electrochemical reactions. The battery degradation process is highly non-linear and may be affected by many factors, such as temperature, charge, and discharge rate; many electrochemical side reactions and operating conditions of the anode, electrolyte, and cathode may severely affect performance, thereby affecting the battery life. This may complicate battery capacity prediction. Therefore, how to accurately predict the RUL under various working conditions is a crucial and challenging problem in a Battery Management System (BMS). From an economic point of view, RUL prediction may help reduce the return on investment of the system and increase the profitability of the system. If the RUL can be accurately predicted, the equipment may be maintained predictively, and battery life may be extended.

Conventional techniques for predicting RUL are deficient in multiple ways. For example, the conventional techniques may fail at least, if not, each of the following considering dynamics of electrochemical processes, accounting for temperature, considering user battery usage profiles (e.g., 'heavy user', 'light user', 'seasonal user'), considering temperature signals, accounting for properties emanating from physical structure of the battery, accounting for benefits of alternative machine learning models, accounting for battery manufacturer data, and accounting for battery type data, among others.

Some technical advantages to the problems described above include creating a hybrid model that combines a physics-based model data with a machine learning data. The hybrid processing model may decompose hybrid model into sub-elements and distributes these sub-elements into local hardware operations and cloud-based operations. For example, high volume large datasets may be processed in a server in a cloud, where processing resources are high, and low volume data processing and simpler decision engines are local making efficient use of limited resources locally. Further, another advantage may include improving the performance of models continuously during field deployment using an event-based triggered model calibration strategy. Also, historical data from many assets may reveal strengths and weaknesses of assets or batteries in the field at different stages of their lifespan. Further, historical data and current data may be used from an array of similar assets or batteries (e.g., sometimes a single manufacturer, sometimes combining several manufacturers using different battery technologies, etc.). In some embodiments, another technical advantage includes automatically selecting a best machine learning model by using an intelligent model selection engine (IMSE). IMSE evaluates the machine learning models based on performance metrics allowing for selection of a machine learning model most suited to the dataset.

The disclosed techniques may be used in battery chemistries such as lithium-ion family and any electro-chemical application in which asset performance degradation is expected to be detected and quantified for predictive maintenance. The disclosed techniques may be used in personal laptops, mobile phones, electronic watches, rings and other wearable computing devices. The disclosed techniques may also be used in solid state batteries by adapting the physics-based model and in some cases the machine learning model for solid state batteries. The disclosed techniques may be used where there is a physics based ageing model and there is sufficient sensor data to drive machine learning model. For example, by weighting the physics-based model and the machine learning model differently in vast range of applications RUL may be predicted more accurately. Some examples may include gate valves used in the nuclear reactor control systems, turbofan engines, solid state disks, and many other industries.

RUL prediction may also be useful in predictive maintenance and avoiding undesirable component failure. Some applications the disclosed technique enable estimating RUL in calendar days, in number of charge cycles left, equivalent to full cycles, etc.

FIGS. 1 through 21, discussed below, and the various embodiments used to describe the principles of this disclosure are by way of illustration only and should not be construed in any way to limit the scope of the disclosure.

FIG. 1 illustrates a high-level component diagram of an illustrative system architecture 100 according to certain embodiments of this disclosure. In some embodiments, the system architecture 100 may include a cloud-based computing system 116, a computing device 102, a computing device 103, and/or a vehicle 117 communicatively coupled via a network 112. The cloud-based computing system 116 may be a real-time software platform, include privacy software or protocols, or include security software or protocols. Each of the computing device 102, the computing device 103, the vehicle 117, and components included in the cloud-based computing system 116 may include one or more processing devices, memory devices, or network interface cards. The network interface cards may enable communication via a wireless protocol for transmitting data over short distances, such as Bluetooth, ZigBee, NFC, etc. Additionally, the network interface cards may enable communicating data via a wired protocol over short or long distances, and in one example, the computing device 102, the computing device 103, the vehicle 117, and/or the cloud-based computing system 116 may communicate with the network 112. Network 112 may be a public network (e.g., connected to the Internet via wired (Ethernet) or wireless (WiFi)), a private network (e.g., a local area network (LAN) or wide area network (WAN)), or a combination thereof. In some embodiments, network 112 may also comprise a node or nodes on the Internet of Things (IoT).

The computing device 102 may be any suitable computing device, such as a laptop, tablet, smartphone, or computer. The computing device 102 may include a display capable of presenting a user interface of an application. The application may be implemented in computer instructions stored on the one or more memory devices of the computing device 102 and executable by the one or more processing devices of the computing device 102. The computing device may include an asset 118 and/or a battery pack 115, each of which may have a useful life that degrades over time.

The computing device 103 may be any suitable computing device, such as a laptop, tablet, smartphone, or computer. The computing device 103 may include a display capable of presenting a user interface 105 of an application. The application may be implemented in computer instructions stored on the one or more memory devices of the computing device 103 and executable by the one or more processing devices of the computing device 103. The user interface may present various screens to a user that present various views including remaining useful lives of one or more battery or battery packs. The user interface 105 may enable performing a preventive action such as presenting a signal (e.g., warning signal that the RUL is lower than a threshold) and/or changing an operating parameter of the vehicle to consume less energy from the battery, and the like. The computing device 103 may also include instructions stored on the one or more memory devices that, when executed by the one or more processing devices of the computing device 103, perform operations of any of the methods described herein.

The vehicle 117 may be any suitable type of vehicle, such as an automobile, a motorcycle, a boat, an airplane, a bicycle, a scooter, a skateboard, roller skates, roller blades, a unicycle, a surfboard, a drone, or the like. Accordingly, the vehicle may include an engine that is powered by one or more batteries 121, assets 119, and motors. The vehicle 117 may also include one or more sensors 131 that are configured to measure any suitable operating parameter of a vehicle, a temperature of the vehicle 117, a vibration of the vehicle 117, a battery pack current, a battery pack cell voltage, a battery pack cell temperature. The processing device of the vehicle 117 may receive the measurements from the one or more sensors 131 and transmit them via the network 112 to the cloud-based computing system 116 for use in training one or more machine learning models 132. In some embodiments, when a machine learning model is trained and ready to process real-time data, the processing device of the vehicle 117 may receive the measurements from the one or more sensors 131 and use them, along with other data (e.g., a user battery usage profile), to predict the RUL of the battery pack 121 and/or asset 119. The vehicle 117 may execute, using local battery management software hardware, an instance of a physics-based model trained via parameters received from a cloud-based instance of the physics-based model 600. The vehicle 117 may also execute an instance of a machine learning model 132 that is trained using parameters received from a cloud-based machine learning model 132.

In some embodiments, the cloud-based computing system 116 may include one or more servers 128 that form a distributed computing system, which may include a cloud computing system. The servers 128 may be a rackmount server, a router, a personal computer, a portable digital assistant, a mobile phone, a laptop computer, a tablet computer, a camera, a video camera, a netbook, a desktop computer, a media center, any other device capable of functioning as a server, or any combination of the above. Each of the servers 128 may include one or more processing devices, memory devices, data storage, or network interface cards. The servers 128 may be in communication with one another via any suitable communication protocol. The servers 128 may execute one or more physics-based models 600, as described further herein.

The servers 128 may execute an artificial intelligence (AI) engine 140 that uses one or more machine learning models 132 to perform at least one of the embodiments disclosed herein. The cloud-based computing system 116 may also include a database 150 that stores data, knowledge, and data structures used to perform various embodiments. For example, the database 150 may store fleet of electric vehicles since beginning of life (BOL), battery data (e.g., original anode thickness, expected cycle loss, etc.) received from a manufacturer of the battery, lab experiment data pertaining to the battery, user battery usage profile, etc. For example, the database 150 may store all or some of that data as a battery ageing dataset. Although depicted separately from the server 128, in some embodiments, the database 150 may be hosted on one or more of the servers 128.

In some embodiments, the cloud-based computing system 116 may include a training engine 130 capable of generating one or more machine learning models 132. Although depicted separately from the AI engine 140, the training engine 130 may, in some embodiments, be included in the AI engine 140 executing on the server 128. In some embodiments, the AI engine 140 may use the training engine 130 to generate the machine learning models 132 trained to perform inferencing and/or predicting operations. The machine learning models 132 may be trained to predict the RUL, among other things. The one or more machine learning models 132 may be generated by the training engine 130 and may be implemented in computer instructions executable by one or more processing devices of the training engine 130 or the servers 128. To generate the one or more machine learning models 132, the training engine 130 may train the one or more machine learning models 132. The one or more machine learning models 132 may be used by any of the methods described herein.

The training engine 130 may be a rackmount server, a router, a personal computer, a portable digital assistant, a smartphone, a laptop computer, a tablet computer, a net-book, a desktop computer, an Internet of Things (IoT) device, any other desired computing device, or any combi-nation of the above. The training engine 130 may be cloud-based, be a real-time software platform, include pri-vacy software or protocols, or include security software or protocols.

To generate the one or more machine learning models 132, the training engine 130 may train the one or more machine learning models 132. The training engine 130 may use a base training data set including inputs of cell manu-facturer battery data, battery lab experiment data (e.g., if simulation fails), user battery usage profile data, solid elec-trolyte interface (SEI) thickness data, battery pack current data, cell voltages data, cell temperatures data, fleet data pertaining to the battery data, among other things. One or more combinations of the inputs may be mapped to an output pertaining to a remaining useful life of each cell of the battery pack.

The one or more machine learning models 132 may refer to model artifacts created by the training engine 130 using training data that includes training inputs and corresponding target outputs. The training engine 130 may find patterns in the training data wherein such patterns map the training input to the target output and generate the machine learning models 132 that capture these patterns. Although depicted separately from the server 128, in some embodiments, the training engine 130 may reside on server 128. Further, in some embodiments, the artificial intelligence engine 140, the database 150, or the training engine 130 may reside on the computing device 102.

As described in more detail below, the one or more machine learning models 132 may comprise, e.g., a single level of linear or non-linear operations (e.g., a support vector machine (SVM) or the machine learning models 132 may be a deep network, i.e., a machine learning model comprising multiple levels of non-linear operations. Examples of deep networks are neural networks, including generative adver-sarial networks, convolutional neural networks, recurrent neural networks with one or more hidden layers, and fully connected neural networks (e.g., each artificial neuron may transmit its output signal to the input of the remaining neurons, as well as to itself). For example, the machine learning model may include numerous layers or hidden layers that perform calculations (e.g., dot products) using various neurons.

For example, the machine learning model 132 trained to use causal inference may accept one or more inputs, such as (i) assumptions, (ii) queries, and (iii) data. The machine learning model 132 may be trained to output one or more outputs, such as (i) a decision as to whether a query may be answered, (ii) an objective function (also referred to as an estimand) that provides an answer to the query for any received data, and (iii) an estimated answer to the query and an estimated uncertainty of the answer, where the estimated answer is based on the data and the objective function, and the estimated uncertainty reflects the quality of data (i.e., a measure which takes into account the degree or salience of incorrect data or missing data). The assumptions may also be referred to as constraints and may be simplified into state-ments used in the machine learning model 132. The queries may refer to scientific questions for which the answers are desired.

FIG. 2 illustrates example operations of a method 200 for using a hybrid model to predict a remaining useful life of a battery according to certain embodiments of this disclosure. The method 200 is performed by processing logic that may include hardware (circuitry, dedicated logic, etc.), software (such as is run on a computer system or specialized dedi-cated machine), or a combination of both. The method 200 or each of their individual functions, routines, subroutines, or operations may be performed by one or more processors of a computing device (e.g., any component of FIG. 1, such as server 128 executing the artificial intelligence engine 140). In certain implementations, the method 200 may be performed by a single processing thread. Alternatively, the method 200 may be performed by two or more processing threads, each thread implementing one or more individual functions, routines, subroutines, or operations of the meth-ods. In some embodiments, one or more accelerators may be used to increase the performance of a processing device by offloading various functions, routines, subroutines, or opera-tions from the processing device. One or more operations of the method 200 may be performed by the training engine 130 of FIG. 1.

For simplicity of explanation, the method 200 is depicted and described as a series of operations. However, operations in accordance with this disclosure can occur in various orders or concurrently, and with other operations not pre-sented and described herein. For example, the operations depicted in the method 200 may occur in combination with any other operation of any other method disclosed herein. Furthermore, not all illustrated operations may be required to implement the method 200 in accordance with the dis-closed subject matter. In addition, those skilled in the art will understand and appreciate that the method 200 could alter-natively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

At 202, the processing device may receive first data pertaining to a battery pack 121 and/or asset 119 of a vehicle 117. The first data may be received from one or more sensors 131 associated with the vehicle 117, and the data pertains to a battery current, a cell voltage, a cell current, a cell temperature, or some combination thereof. In some embodi-ments, the processing device may receive fifth data includ-ing a user battery usage profile including information per-taining to acceleration, deceleration, braking, mileage in a given time period, speed, or some combination thereof. The fifth data may include charging habits of the user. For example, the charging habits may include information pertaining to a frequency of charging the battery pack and/or a type (e.g., fast or standard) of battery pack charging selected by the user.

At 204, the processing device may receive second data pertaining to simulation data (e.g., the simulation data may include battery pack current (I), cell voltages (V), and/or cell temperatures (T) of the battery pack). In some embodiments, the second data is received when sensor data for the sensors 131 is missing.

At 206, the processing device may receive third data pertaining to the battery pack from a manufacturer of the battery pack. The data from the manufacturer may relate to the original anode thickness of the battery, an expected cycle loss of the battery, etc.

At 207, the processing device may receive fourth data pertaining to lab experiments data associated with the battery pack. The lab experiments data may include details of experiments run on the battery pack and results of the experiments. For example, the lab experiments may include testing how well the battery pack performs (e.g., length of life of each cell) under certain conditions (e.g., temperature, moisture, vibration, etc.).

At 208, the processing device may receive historical data on a fleet of vehicles that use the battery pack. The historical fleet data may relate to BOLs and expected degradation related to EOL and ROL based on analyzed data of batteries used in the fleet.

At 210, the processing device may predict a remaining useful life of each cell of the battery pack 121 and/or asset 119 of the vehicle 117 by using a hybrid model. Each cell may degrade differently than other cells within the battery pack and being able to accurately predict RUL of each cell can improve efficiency and use of the battery pack. Some battery cells may age quicker than others and, in some cases, rather than replacing the whole battery pack, a few failing cells may be replaced. In some embodiments, when the RUL of each cell of the battery pack 121 is predicted, the processing device may predict the overall RUL of the battery pack 121. In some embodiments, if battery cell level information is not available, the processing device may predict the RUL of the battery pack 121.

In some embodiments, the hybrid model may use a physics-based model and a machine learning model 132 to predict the remaining useful life of an asset. The physics-based model may be configured to receive at least one of the first data, the second data, the third data, the historical data, and the fifth data to generate one or more properties pertaining to the battery pack. The one or more properties may include an internal state of the battery pack and/or cell including over-potentials related to an electrode, a loss of cyclable lithium, a loss of active material, a change in solid electrolyte interphase thickness, a state of health, a capacity loss, a resistance increase due to degradation, or some combination thereof.

The machine learning model 132 and its parameters (e.g., number of nodes, layers, types of activation functions, etc.) may be received, by the vehicle 117 from the cloud-based computing system 116. The machine learning model may be configured using the parameters and may use at least the one or more properties to predict the remaining useful life of each cell of the battery pack. Prior to being received by the vehicle 117, the cloud-based computing system 116 trains the machine learning model 132 by optimizing one or more hyper-parameters in an iterative process. Further, the cloud-based computing system 116 may extract one or more features from at least one of the first data, second data, third data, fourth data, and fifth data. Once the machine learning model is configured based on the parameters, real-time data (e.g., sensor data) and/or user usage profile battery usage profile is received at the processing device of the vehicle and the hybrid model predicts the remaining useful life in real-time based on the real-time data.

In some embodiments, the processing device may auto-calibrate the hybrid model based on a trigger event occurring. The trigger event may include a physics-based model estimated terminal voltage exceeding an actual voltage of the battery pack by a threshold amount.

At 212, the processing device may transmit the remaining useful life of each cell of the battery pack for presentation on a user interface of a computing device. In some embodiments, the processing device may transmit the remaining useful life of each cell of the battery pack and/or each cell as a number of full cycles left to be used before the battery pack reaches an end of life state. In some embodiments, the computing device may be associated with a user.

In some embodiments, based on the remaining useful life, the processing device may perform a preventative action. The preventative action may include causing an operating parameter of the vehicle to change to consume less charge of the battery pack, change cells in some battery packs or service the battery packs, service some of the cells, issue an advisory message on use of the battery pack, notify a service manager of the state of the battery pack, or some combination thereof.

FIG. 3 illustrates example operations of a method 300 for using a trained machine learning model at a vehicle to predict a remaining useful life according to certain embodiments of this disclosure. The method 300 is performed by processing logic that may include hardware (circuitry, dedicated logic, etc.), software (such as is run on a computer system or specialized dedicated machine), or a combination of both. The method 300 or each of their individual functions, routines, subroutines, or operations may be performed by one or more processors of a computing device (e.g., any component of FIG. 1, such as server 128 executing the artificial intelligence engine 140, or a processing device of the vehicle 117). In certain implementations, the method 300 may be performed by a single processing thread. Alternatively, the method 300 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 300 may be performed by the training engine 130 of FIG. 1. The method 300 may be performed in a similar manner as the method 200 of FIG. 2.

At 302, the processing device may receive, from a cloud-based computing system 116, one or more trained machine learning model parameters that are configured to enable predicting a remaining useful life of a battery pack 121 and/or asset 119 of a vehicle 117. In some embodiments, the processing device may be applied to a machine learning model stored in a memory of the vehicle 117 to generate a trained machine learning model.

At 304, the processing device may load, into memory associated with a processing device at the vehicle 117, the trained machine learning model parameters.

At 306, the processing device may receive data including one or more measurements and one or more user profile classifications. The data may include data determined by a physics-based model that uses thermal single particle model with electrolyte or determined by another physics-based model. The data may have been preprocessed by the cloud-based computing system 116 to transform the data from a first format to a second format that is compatible with the trained machine learning model 132. The cloud-based computing system may extract one or more labels from the data and use the one or more labels during training of the machine learning model 132 to predict the remaining useful life of each cell of the battery pack 121 and/or asset 119. In some embodiments, the cloud-based computing system 116 may calibrate the physics-based model based on a trigger event. The trigger event may include determining when a physics-based model estimated terminal voltage exceeds an actual voltage of the battery pack 121 and/or asset 119.

At 308, based on the data, the processing device of the vehicle 117 may execute the trained machine model to input the data and to output the remaining useful life of each cell of the battery pack. In some embodiments, the processing device may cause presentation, on a user interface 105, the remaining useful life of each cell of the battery pack 121 or asset 119 and/or transmit to computing device 102 and/or 103, via an application programming interface, the remaining useful life of each cell of the battery pack 121 or asset 119.

In some embodiments, based on the remaining useful life, performing a preventative action, wherein the preventative action includes causing an operating parameter of the vehicle 117 to change to consume less charge of the battery pack 121 and/or asset 119 and/or signaling a user interface 105 and/or computing device 103 to perform a preventative action including changing one or more cells in a pack of batteries or provide a service flag on the user interface 105.

FIG. 4 illustrates example operations of a method 400 for calibrating a machine learning model based on whether a trigger event has occurred according to certain embodiments of this disclosure. The method 400 is performed by process-ing logic that may include hardware (circuitry, dedicated logic, etc.), software (such as is run on a computer system or specialized dedicated machine), or a combination of both. The method 400 or each of their individual functions, routines, subroutines, or operations may be performed by one or more processors of a computing device (e.g., any component of FIG. 1, such as server 128 executing the artificial intelligence engine 140). In certain implementa-tions, the method 400 may be performed by a single pro-cessing thread. Alternatively, the method 400 may be per-formed by two or more processing threads, each thread implementing one or more individual functions, routines, subroutines, or operations of the methods. In some embodi-ments, one or more accelerators may be used to increase the performance of a processing device by offloading various functions, routines, subroutines, or operations from the processing device. One or more operations of the method 400 may be performed by the training engine 130 of FIG. 1. The method 400 may be performed in a similar manner as the method 200 of FIG. 2.

At 402, the processing device may receive data pertaining to a battery pack of a vehicle. The data may be measured by one or more sensors 131 associated with the vehicle 117.

At 404, the processing device may determine, based on the data, whether a sum of a physics-based model estimated terminal voltage minus an actual voltage of the battery satisfies a threshold.

At 406, responsive to determining the threshold is satis-fied, determine a trigger event has occurred and calibrate one or more parameters of the physics-based model, a machine learning model, or both. The physics-model may output one or more properties pertaining to the battery pack of the vehicle, and the machine learning model uses the one or more properties to predict a remaining useful life of each cell of the battery pack. The processing device may train the machine learning model 132 in the cloud-based computing system 116 using at least information from a cell manufac-turer of the battery pack and a user battery pack usage profile. The processing device may use a thermal single particle model with electrolyte algorithm for the physics-based model.

In some embodiments, the physics-based model may be configured to output at least one of a time (e.g., usage), a cell voltage, a current, a charge throughput, and an average solid electrolyte interphase thickness. In some embodiments, the output is fed as input into a physics edge model with a temperature of the battery, a current of the battery, and an initial state of charge of the battery pack 121 and/or asset 119. In some embodiments, the machine learning model may use data from the one or more sensors to predict the remaining useful life of each cell of the battery pack 121 and/or asset 119. In some embodiments, the cloud-based computing system 116 may extract one or more features from the data, lab experiment data, user battery usage profile data, or some combination thereof to train the machine learning model 132 to predict the remaining useful life of each cell of the battery pack.

FIG. 5 illustrates example operations of a method 500 for using a model selection inference engine to select, based on first and second scores for one or more machine learning models, a machine learning model to use to predict the remaining useful life of each cell of the battery pack according to certain embodiments of this disclosure. The method 500 is performed by processing logic that may include hardware (circuitry, dedicated logic, etc.), software (such as is run on a computer system or specialized dedi-cated machine), or a combination of both. The method 500 or each of their individual functions, routines, subroutines, or operations may be performed by one or more processors of a computing device (e.g., any component of FIG. 1, such as server 128 executing the artificial intelligence engine 140). In certain implementations, the method 500 may be performed by a single processing thread. Alternatively, the method 500 may be performed by two or more processing threads, each thread implementing one or more individual functions, routines, subroutines, or operations of the meth-ods. In some embodiments, one or more accelerators may be used to increase the performance of a processing device by offloading various functions, routines, subroutines, or opera-tions from the processing device. One or more operations of the method 500 may be performed by the training engine 130 of FIG. 1. The method 500 may be performed in a similar manner as the method 200 of FIG. 2.

At 502, the processing device may train, using test data, one or more machine learning models 132 to predict a remaining useful life of a battery pack 121 and/or asset 119 of a vehicle 117. At 504, the processing device may use a rule-based evaluator to determine a set of first scores for the one or more machine learning models 132. At 506, the processing device may use a machine learning model based metric evaluator to determine a set of second scores for the one or more machine learning models 132. At 508, the processing device may use a model selection inference engine to select, based on the first and second scores for the one or more machine learning models, a machine learning model 132 to use to predict the remaining useful life of the batter 121 and/or asset 119 of the vehicle 116.

At 510, the processing device may transmit, to a process-ing device of the vehicle 117, the selected machine learning model 132 and model parameters to predict the remaining useful life of each cell of the battery pack 121 and/or asset 19 of the vehicle 117. In some embodiments, the processing device may cause the remaining useful life of each cell of the battery pack 121 and/or asset 119 to be presented as a scalar value on a user interface 105, issue a service message to service one or more cells in the battery pack 121, transmit the service message to a computing device 103 and/or 102 that may merge results from a number of batteries (e.g., battery packs) collected over time to draw advisory notes on improving battery design, or some combination thereof.

In some embodiments, the processing device may receive data from one or more sensors 131 of the vehicle 117 in real-time or near real-time and predict, using the data from the one or more sensors 131, the remaining useful life of each cell of the battery pack 121 and/or asset 119, wherein supplemental simulation data is used when sensor data is not available and the data is augmented further with manufacturer supplied data.

In some embodiments, based on the remaining useful life, the processing device may perform a preventative action. The preventative action may include causing an operating parameter of the vehicle 117 to change to consume less charge of the battery, changing some cells or advisory messages on driving, or some combination thereof.

In some embodiments, the processing device may automatically calibrate the one or more machine learning models 132 when a trigger event occurs.

In some embodiments, the processing device of the vehicle 117 may execute the selected machine learning model 132 with real-time or near real-time sensor data.

In some embodiments, the processing device may include using a physics-based model to determine one or more properties of the battery pack 121 and inputting the one or more properties of the battery pack 121 into the selected machine learning model 132 to predict the remaining useful life of each cell of the battery pack 121 of the vehicle 117.

Figure 6:
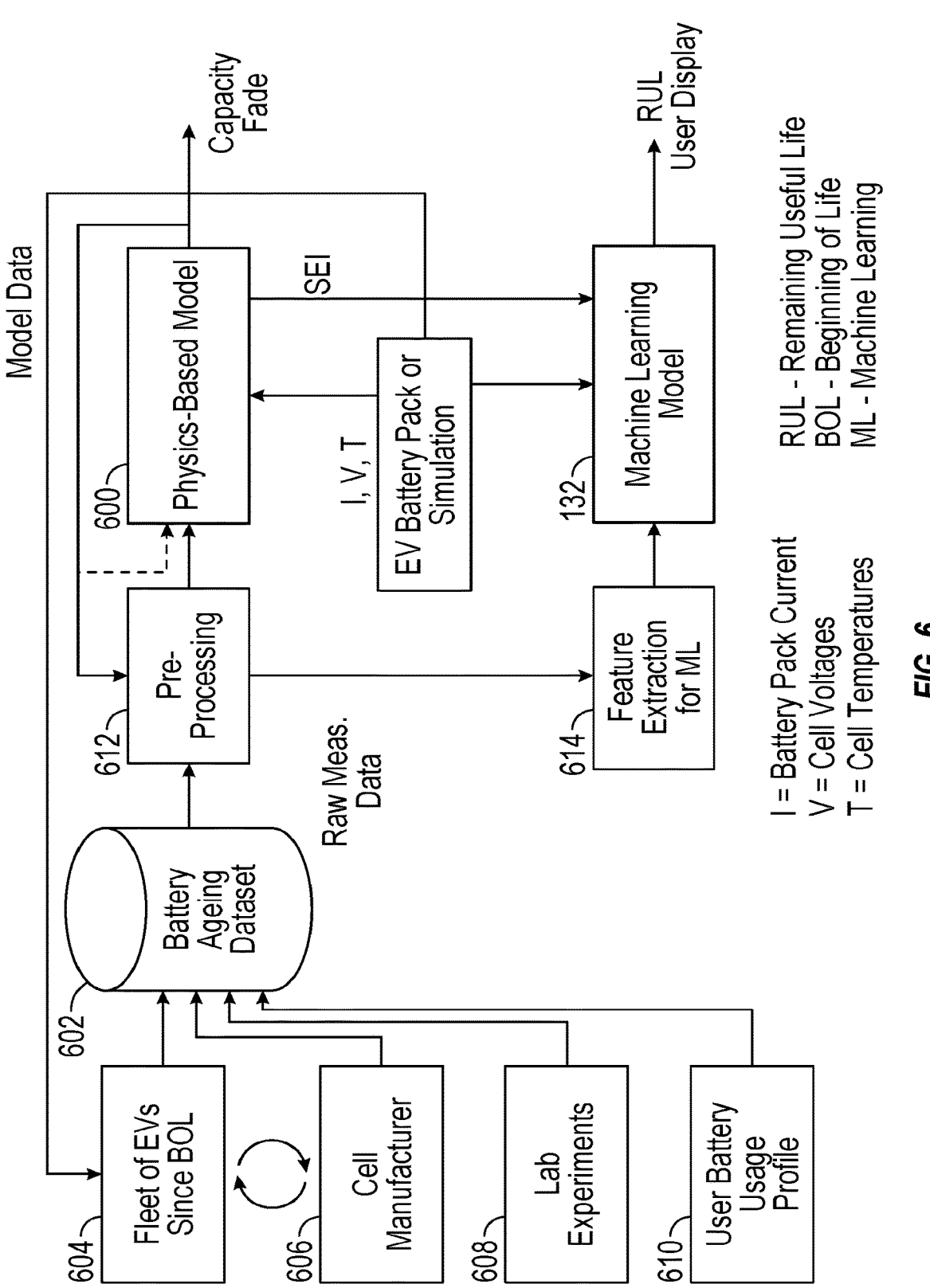
FIG. 6 illustrates an architecture of using a physics-based model and a machine learning model to predict a remaining useful life of an asset according to certain embodiments of this disclosure.

FIG. 6 illustrates an architecture of using a physics-based model 600 and a machine learning model 132 to predict a remaining useful life of an asset 119 (e.g., such as battery pack 121) according to certain embodiments of this disclosure. As depicted, a battery ageing dataset 602 includes data such as model data comprising electric vehicle pack sensor data or sensor data related to battery pack current, cell current, cell voltages, and cell temperatures, which is continuously updated as the current battery pack ages or degrades. The battery ageing dataset 602 also includes cell manufacturer battery pack data 606, lab experiments data 608, and user battery usage profile data 610.

The battery ageing dataset 602 is used in prognosticating RUL may improve the accuracy of the predicted RUL. This this end, the techniques disclosed herein use several groups of data. Battery cells have unique characteristics depending on materials used, their construction, and so forth. Further, the physics of cells play a role in the prediction of the battery's RUL.

Further, the cell manufacturer data 606 may enhance the prediction of the RUL because it provides characterization data (e.g., how many cycles they expect), static capacity and open voltage set, hybrid pulse power characteristics, open circuit voltage test, etc.

The lab experiments data 608 supplements and compliments cell manufacturer's data. In some cases, specific operational requirements mandate data in such circumstances. For example, operation at −20 C [−4 F] ambient. The disclosed techniques may include inclusion of many specific data in many different operational requirements.

The user battery usage profile 610 may include different levels of users, for example, a "light user" may operate the vehicle for 2,000 miles per year and a "heavy user" may operate the vehicle for 30,000 miles per year. Other data may be included in the user battery usage profile 610 such as the acceleration, braking, deceleration habits of the user, charging habits of the user, and the like. The user battery usage profile 610 may provide enhanced accuracy in predicting the RUL.

In some embodiments, the vehicle 117 collects relevant data using sensors 131 or other mechanisms from the asset or battery (e.g., battery pack current, cell voltages, cell temperatures, cell capacity, etc.). The battery ageing dataset 602 collected from the asset or battery may create a "ground truth" data. Ground truth data may be used in machine learning algorithms to operate accurately. Some of the data collected from asset 119 or battery pack 121 implicitly contain useful information. For example, a certain cell temperature may indicate cooling efficiency and implicitly adds seasonal factors into the RUL prediction which may yield higher accuracy. Also, cell temperature being above normal may indicate lower cooling efficiency due to outside temperature.

The battery ageing dataset 602 may be input into a pre-processing step 612 where the data is transformed from a first format to a second format that is able to be efficiently processed by the physics-based model 600 and the machine learning model 132. Once the data is pre-processed, feature extraction 614 may be performed to identify and extract one or more features for the machine learning model 132. Further, the formatted data may be input to the physics-based model 600 that outputs a capacity fade of the battery. Sensor data or simulation data pertaining to the battery pack current, cell current, cell voltages, and/or cell temperatures may be input into the physics-based model 600 and/or machine learning model 132. The physics-based model may be configured to output a solid electrolyte interphase (SEI) that is used as an input by the machine learning model, as well as the features extracted from the formatted battery ageing dataset 602 to predict a RUL. The predicted RUL may be presented on a user interface 105.

Simulation data may complement and/or supplement data from sensor measurements and/or lab experiment data pertaining the battery. Simulation may be used to fill one or more gaps when sensor data is not available. Further, simulation may supply additional data projected based on measured values. For example, a simulated battery pack may be calibrated with available data under limited operating conditions such as 10 C [50 F] and 25 C [77 F]. Simulation may project data linearly or non-linearly to other temperatures, which may reduce the requirement on real tests. Simulation may also help reducing costs and hazards as simulation can reliably replace measured/sensed data. Simulated battery models with integrated degradation mechanisms may also enable usage of ML models that learn by trial-and-error such as reinforcing learning.

For prognosticating RUL, in some embodiments, the disclosed techniques use is a hybrid model combining physics-based model 600 and machine learning model 132 (sometimes referred to as data-driven machine learning model herein).

The physics-based model 600 may use battery degradation mechanisms that emanates from physical properties of the asset to predict RUL. For lithium ion based batteries such properties may include, but not limited to, diffusion constant of the cathode/anode, rate constant of the main li-insertion reaction at the cathode/anode, DC resistance of the battery, SEI (solid electrolyte interphase) thickness and others. The physics-based model 600 may also use additional data from the battery pack 121 and/or asset 119 and/or simulation data. Physics-based models 600 may include DFN (Doyle-Fuller-Newman), SPM (Single Particle Model), TSPMe (Thermal Single Particle Model with electrolyte). There are also enhanced versions of DFN, SPM, TSPMe models that incorporate battery ageing mechanisms.

The disclosed techniques may be independent of physical modelling methods and may incorporate any model with (enhanced versions of DFN, SPM, TSPMe models that incorporate battery ageing mechanisms) or without (DFN (Doyle-Fuller-Newman), SPM (Single Particle Model), TSPMe (Thermal Single Particle Model with electrolyte) ageing mechanism. The physics-based model 600 may include other potential improvements of suggested model.

In some embodiments, the physics-based model 600 model may output an internal state of the battery pack 121 or asset 119 describing properties including, but not limited to, over-potentials related to the electrodes, loss of cyclable lithium, loss of active material, change in SEI layer thickness, SOH (state of health), capacity loss and resistance increase due to various degradation phenomena, etc. These estimates may be used as additional data in the machine learning model 132. The machine learning model 132 may also output its own estimate of parameter modifications. Such data may be fed back to the physics-based model 600 and/or the pre-processing 612 stage to be used in the machine learning model's 132 new prediction of RUL.

In some embodiments, the machine learning model 132 may use one or more machine learning models. A best may be selected automatically based on one or more evaluation metrics. A training data set may include physics-based model output, measured data via sensors 132, simulated data, and/or user battery usage profile data. Several machine learning models may be concurrently trained and/or calibrated. The output of intelligently selecting the best machine learning model is chosen. Selection process is automated, as described further herein. The best ML machine learning model outputs parameters to 'inference engine'. Real-life data (e.g., real-time sensor measurements) may be input to inference engine to enable the inference engine to process with the parameters. In some embodiments, the result of the process and use of the hybrid model may be a highly accurate estimate of RUL. The RUL may be a single value in terms of number of days to reach EOL or it may be a trajectory of capacity points until EOL is reached. Further RUL can be expressed as number of full cycles left to be used. Additionally, RUL may be displayed both on locally on a computing device used in the vehicle 117 and/or remotely on a computing device 103 of a fleet manager, for example.

Figure 7:
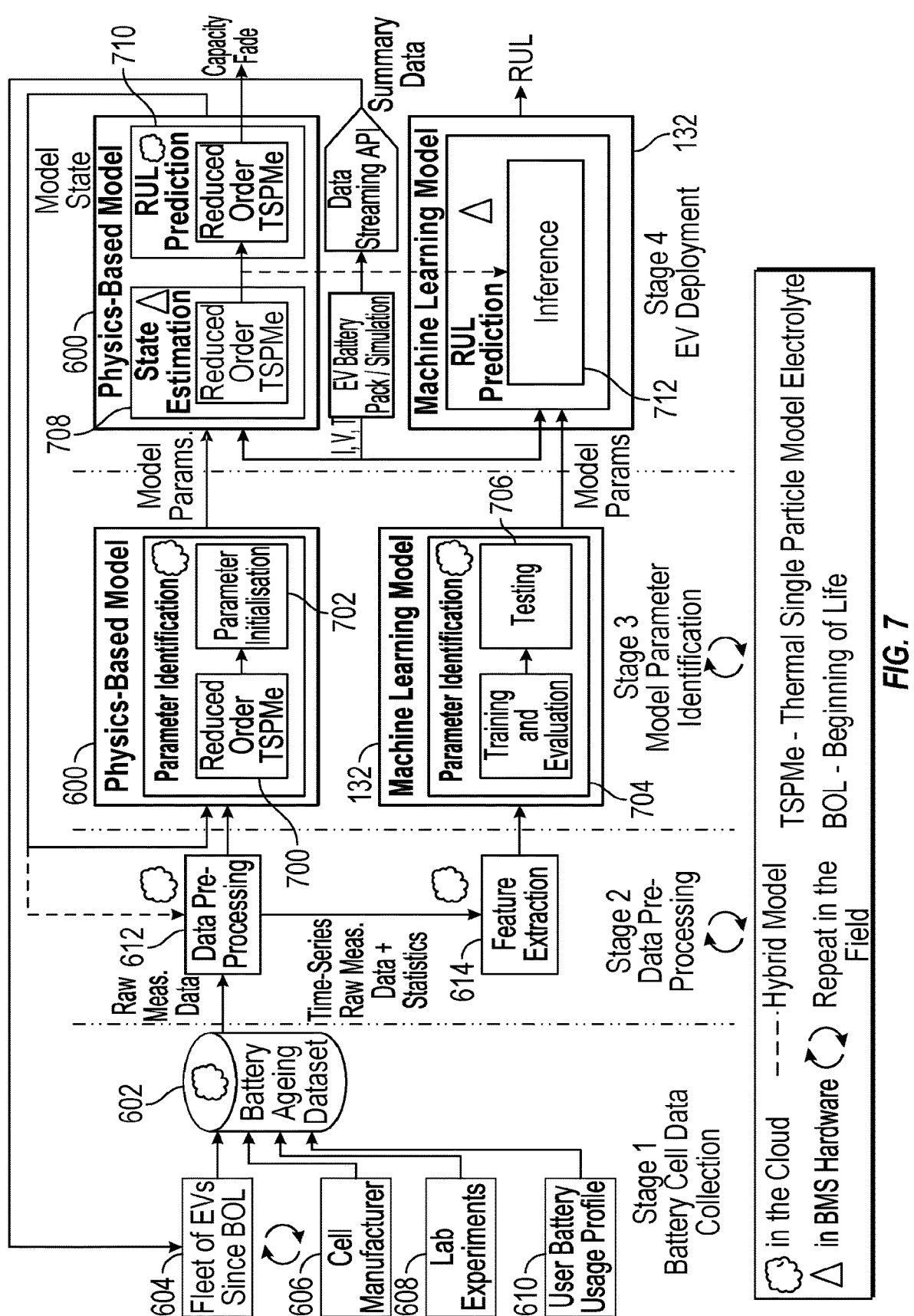
FIG. 7 illustrates various stages included in using the physics-based model and the machine learning model to predict the remaining useful life of an asset according to certain embodiments of this disclosure.

FIG. 7 illustrates various stages included in using the physics-based model 600 and the machine learning model 132 to predict the remaining useful life of an asset according to certain embodiments of this disclosure. The FIG. 7 provides a legend of icons that each represent a cloud, battery management system (BMS) hardware, hybrid model, repeat in the field, thermal particle model electrolyte, and beginning of life, as depicted. The stages include stage 1 battery cell data collection, stage 2 data pre-processing, stage 3 model parameter identification, and stage 4 electric vehicle deployment.

At stage 1, the various data 604, 606, 608, and 610 are collected in the battery ageing dataset 602 in the cloud-based computing system 116, as depicted by the cloud icon at the battery ageing dataset 602.

At stage 2, the raw measurement data is pre-processed 612 in the cloud (based on the depicted icon). Time-series raw measurement data and statistics are transmitted to the feature extraction 614 in the cloud (based on the depicted icon). This stage is continuously repeated in the field (based on the repeat in the field icon depicted at the bottom of stage 2) as new data is collected, simulated, and/or predicted.

At stage 3, the pre-processed data is transmitted to the physics-based model 600, which performs parameter identification (based on the depicted icon). The parameter identification may include reduced order TSPMe 700 and then parameter initialization 702. Further, in stage 3, the extracted features may be transmitted to the machine learning model 132, which performs parameter identification in the cloud (based on the depicted icon). The parameter identification may include training and evaluation 704 and testing 706.

At stage 4, the selected model parameters are transmitted from the cloud-based computing system 116 instance of the physics-based model 600 to the vehicle-based instance of the physics-based model 600. Further, the physics-based model 600 may receive sensor data and/or simulated data related to battery pack current, cell voltages, and/or cell voltage. Using various data groups with different usage profiles to predict future state is done in the cloud as significant computing resources may be required to process big data. Processed data may then supplied to the edge device (BMS hardware) to estimate the current state.

The physics-based model 600 may use the received model parameters, the sensor data, and/or simulated data and the local BMS hardware (as depicted by the icon) to perform state estimation 708 that performs reduced order TSPMe.

The output from the reduced order TSPMe may include an SEI that is transmitted to an inference engine 712 via a hybrid model configuration (depicted by dashed line). The output from the reduced order TSPMe is transmitted to the cloud-based computing system instance of the physics-based model to perform RUL prediction 710 via reduced order TSPMe again. The output from this is capacity fade.

Further, at stage 4, the model parameters are transmitted to the machine learning model 132 executing locally on the BMS hardware and the inference engine 712 may receive model parameters from the cloud-based machine learning model 132, and may also receive sensor data, and/or simulated data related to the battery pack current, cell voltages, and/or cell temperatures. The inference engine 712 may predict, based on the received model parameters, the sensor data, and/or simulated data, the RUL.

Model performance may be continuously improved during field deployment using event-based triggered model calibration strategy in stage 3, which may consist of model parameter identification automatic calibration is triggered when V_-V> threshold OR when set duration of vehicle data is collected from field operations. V_ is the physics-based model estimated terminal voltage and V is the actual voltage.

Figure 8:
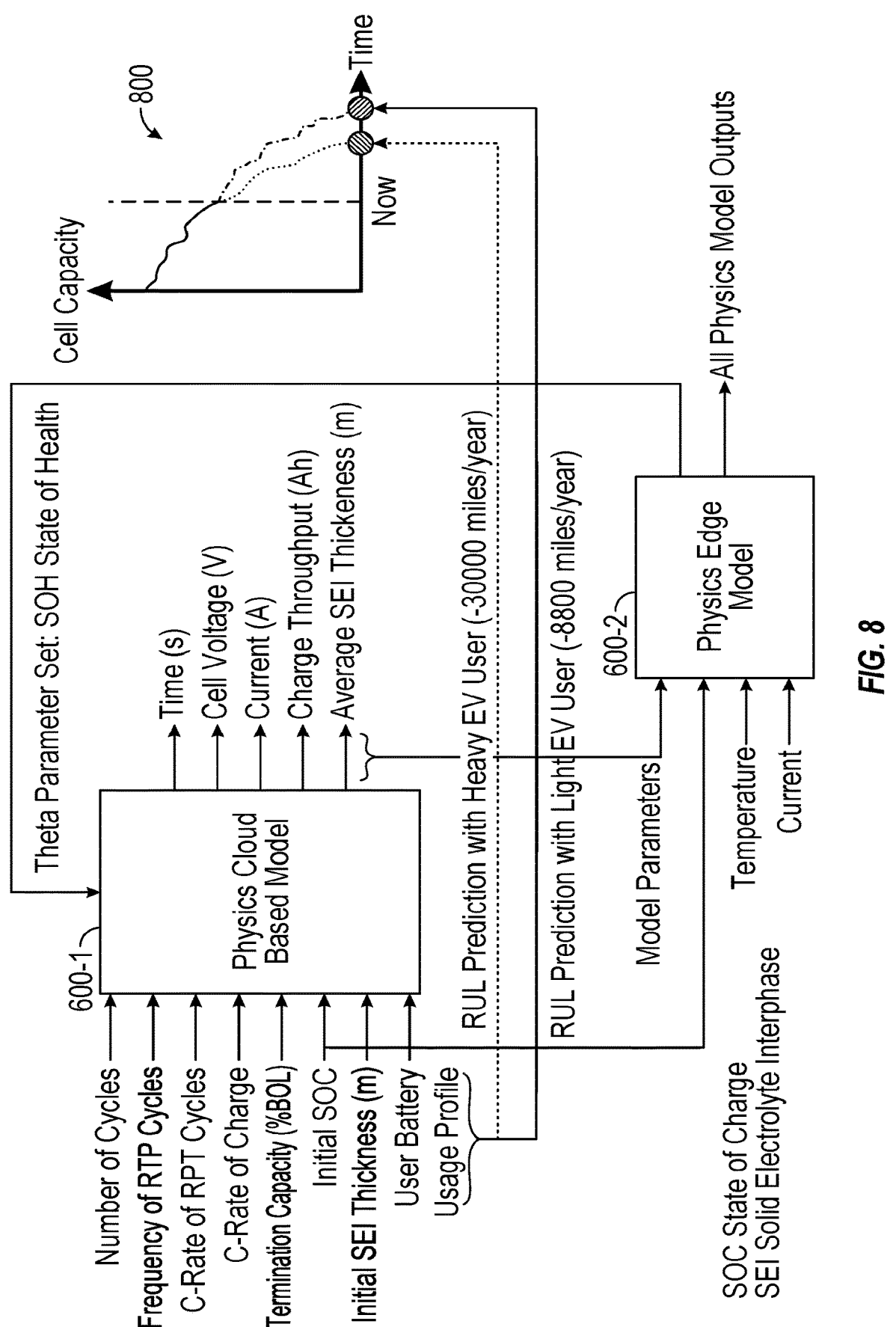
FIG. 8 illustrates an architecture of the physics-based model according to certain embodiments of this disclosure.

FIG. 8 illustrates an architecture of the physics-based model 600 according to certain embodiments of this disclosure.

The SEI (Solid Electrolyte Interphase) is formed on the surface of the anode from the electrochemical reduction of the electrolyte and plays a crucial role in the long term cyclability of a lithium based battery.

The physics-based model 600 may include a physics cloud-based model 600-1 and a physics edge model 600-2. One purpose of the physics cloud-based model 600-1 may be to predict trajectory of RUL with different usage scenarios. The physics edge model 600-2 may periodically provide a "Theta" parameter set which may represent the state of each cell so that the physics cloud-based model 600-1 may have initial conditions in its prediction. The main state is the state-of-health (SOH). SOH may be a combination of parameters including SEI that describes battery state in one simple value. The SEI growth model acts as the SOH estimate. Additional ageing mechanisms (porosity change, plating models) may also be included in SOH. RUL model 800 may start from 100% SOC. The physics edge model 600-2 may output the SEI growth model that is input to the physics cloud-based model 600-1. The physics clod-based model 600-1 may receive an initial SEI thickness as input.

The physics cloud-based model 600-1 may receive as inputs one or more of: theta parameter set (SOH state of health), number of cycles, frequency of RTP cycles, c-rate of RPT cycles, c-rate of charge, termination capacity (% BOL), initial SOC, initial SEC thickness (m), and user battery usage profile.

The outputs of the physics cloud-based model 600-1 may include time (S), cell voltage (V), current (A), charge throughput (Ah), average SEI thickness (m).

The inputs to the physics edge model 600-2 may include the model parameters (time (S), cell voltage (V), current (A), charge throughput (Ah), average SEI thickness (m)), initial SOC, cell temperature, and cell current. The raw sensor inputs such as cell voltage, cell current, and cell temperature may be used to derive features for physics edge model SEI thickness output. The raw inputs may include a number of cycles The RUL model 800 depicts cell capacity on the Y axis and time on the X axis. The RUL model 800 depicts where a RUL prediction results for a heavy electric vehicle user (~30000 miles/year) and for a RUL prediction results for a light electric vehicle user (~8800 miles/year). The results for each of the light user and the heavy user are based on the physics model outputs.

Figure 9:
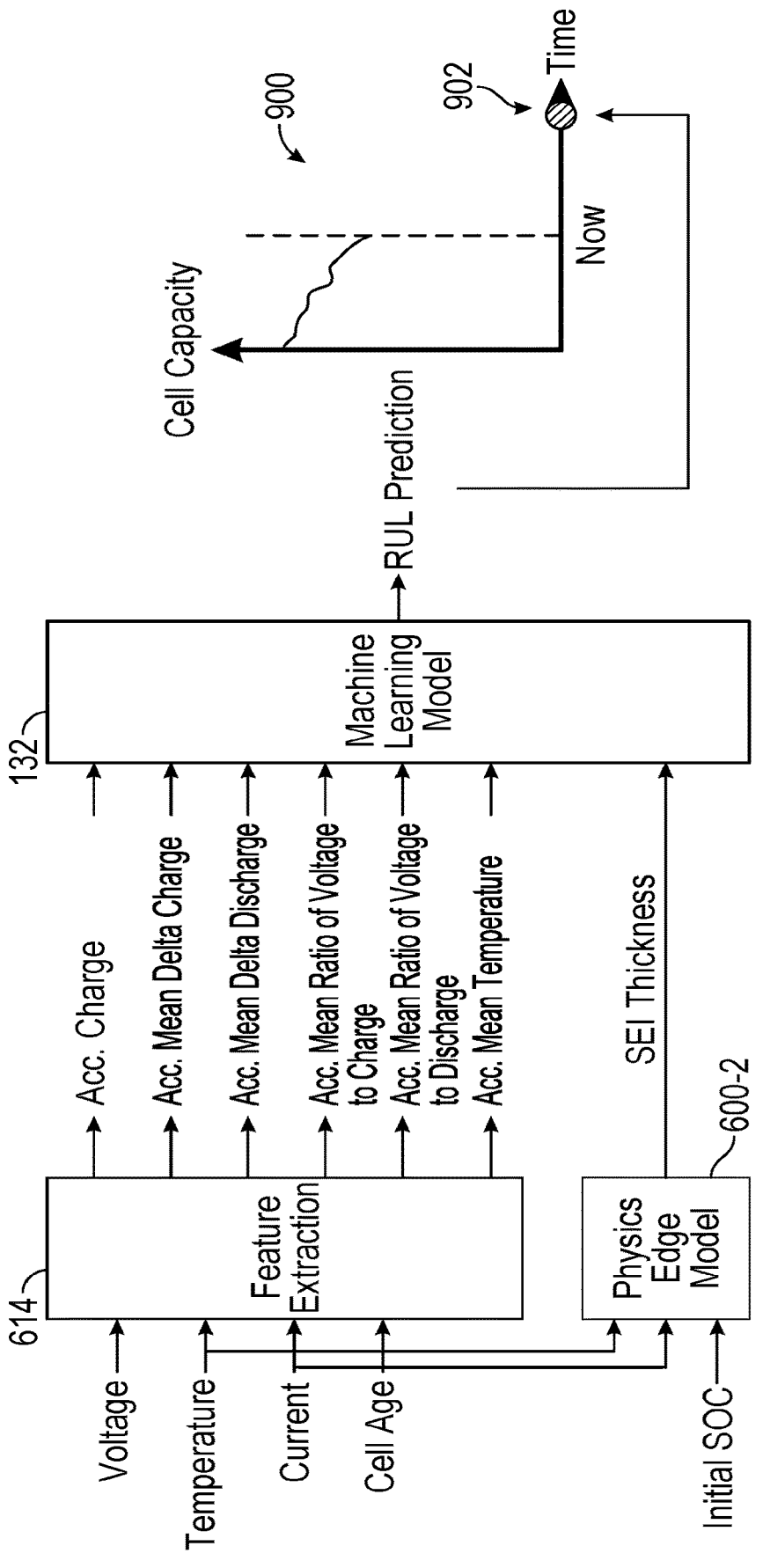
FIG. 9 illustrates an architecture of the hybrid model predicting, based on inputs from feature extraction and the physics based model, a remaining useful life of an asset according to certain embodiments of this disclosure.

FIG. 9 illustrates an architecture of the hybrid model predicting, based on inputs from feature extraction 614 and the physics edge model 600-2, a remaining useful life of an asset 119 (e.g., battery pack 121) according to certain embodiments of this disclosure;

Raw sensor inputs such as cell voltage, current and temperature may be used to derive features during feature extraction 614 for the machine learning model 132. More features are extracted from data groups such as cell manufacturer data, fleet data, lab experiments, simulation data, and user battery usage profiles. The machine learning model 132 may receive, from the feature extraction 614, an accumulated charge, an accumulated mean delta charge, an accumulated mean ratio of voltage to charge, an accumulated mean ratio of voltage to discharge, and an accumulated mean temperature as inputs.

The physics edge model 600-2 may receive a temperature, a current, and an initial SOC as inputs and may output the SEI thickness to the machine learning model 132. The machine learning model 132 may use extracted features and the SEI thickness from the physics edge model 600-2 to produce its prediction of RUL as a single shot value.

The RUL model 900 depicts an indication of where the cell capacity is now (dashed line) and a location of time 902 where the RUL is predicted.

Figure 10:
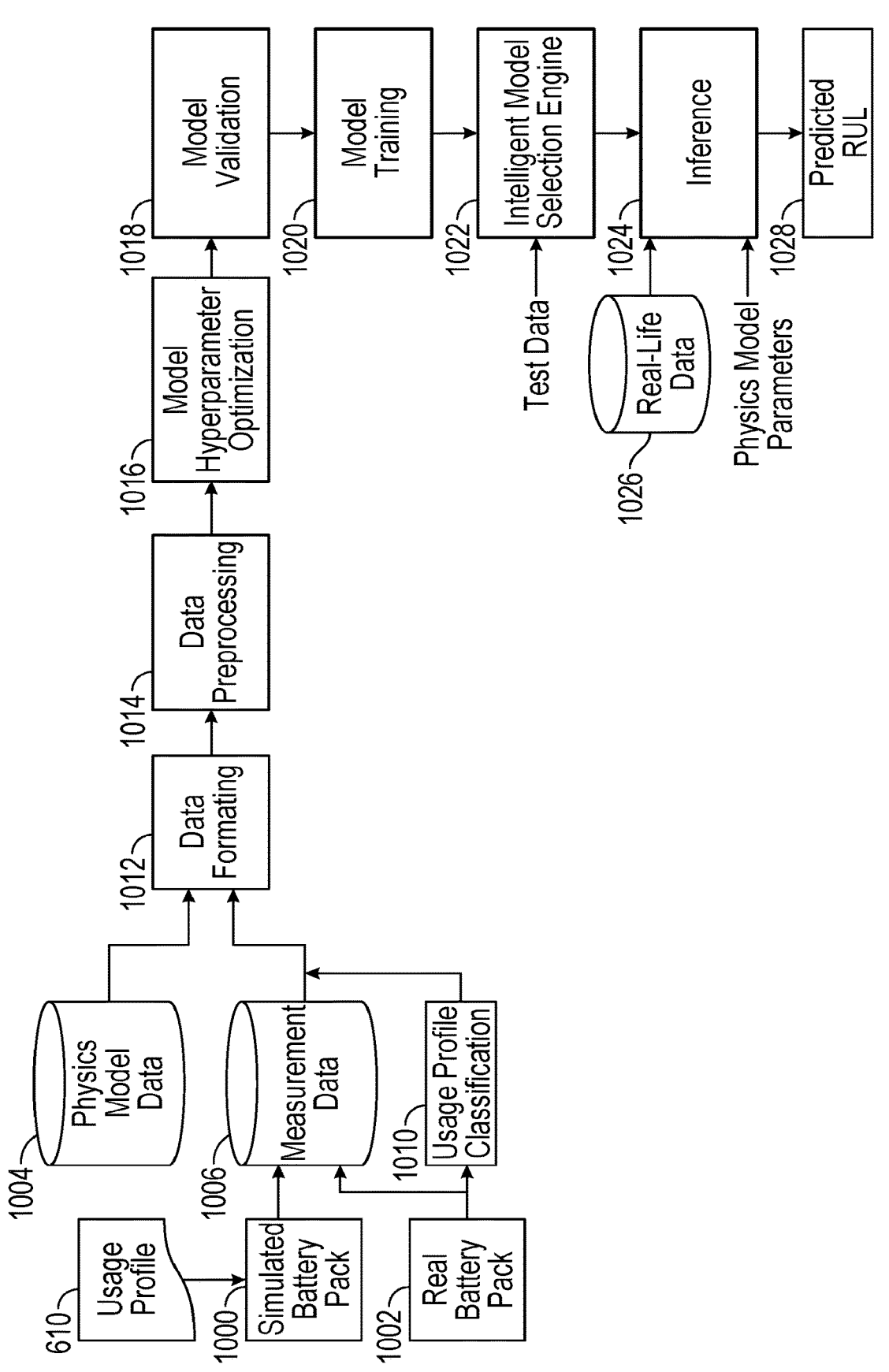
FIG. 10 illustrates an overall machine learning pipeline overview according to certain embodiments of this disclosure.

FIG. 10 illustrates an overall machine learning pipeline overview according to certain embodiments of this disclosure. All stages before inference 1024 generally trains, calibrates and prepares models for field deployment. Intelligent model selection engine selects a best model suited to data and customer requirements. Inference is local in BMS hardware in the vehicle 117 and it is this stage 1024 where hybrid model deployed and results are presented to the user.

Raw data collected from real life and synthetic data produced by external model are brought to a common format. Then, it is made suitable for the model by feature extraction and pre-processing. The optimal hyper-parameter set is sought for the model. The model is evaluated with the optimal hyper-parameter set, and then trained with all the data. Real-life data is pre-processed and fed to the machine learning model 132 at the inference 1024 stage, and the RUL estimation is produced. The estimated value is shown to fleet manager, teams managing test fleets, OEM teams tracking vehicle status, manufacturers and potentially also individual users. Further, the predicted RUL can be used to perform a preventative action as described herein.

The flow may be described as a user batter usage profile 610 is input to a simulated battery pack 1000 to generated simulated data is stored in the measurement dataset 1008. Real battery pack 1002 measurements are obtained from the sensors 131 and stored in the measurement dataset 1008. The real battery pack 1002 measurements are input into a usage profile classification stage 1010 that classifies the user battery usage profile based on the measurements. The measurement dataset 1008 and the usage profile classification 1010 are input to a data formatting 1012 stage as well as physics model data 1004. The data formatting 1012 transforms the data to a new format compatible and efficient for processing by the models and enters a data pre-processing 1014 stage. Then the model hyperparameter optimization 1016 stage is entered where desired hyperparameters are selected. A model validation 1018 stage is performed where one or more machine learning models are validated based on the hyperparameters, and at stage 1020, the machine learning models are trained. At stage 1022, test data is applied each of the trained machine learning models and an optimal machine learning model is selected based performance (e.g., most accurate, fastest, etc.) on the test data. At stage 1024, real-life data (e.g., sensor measurements, user battery usage profile, etc.) 1026 are entered into the selected machine learning model and a RUL is predicted at stage 1028.

Figure 11:
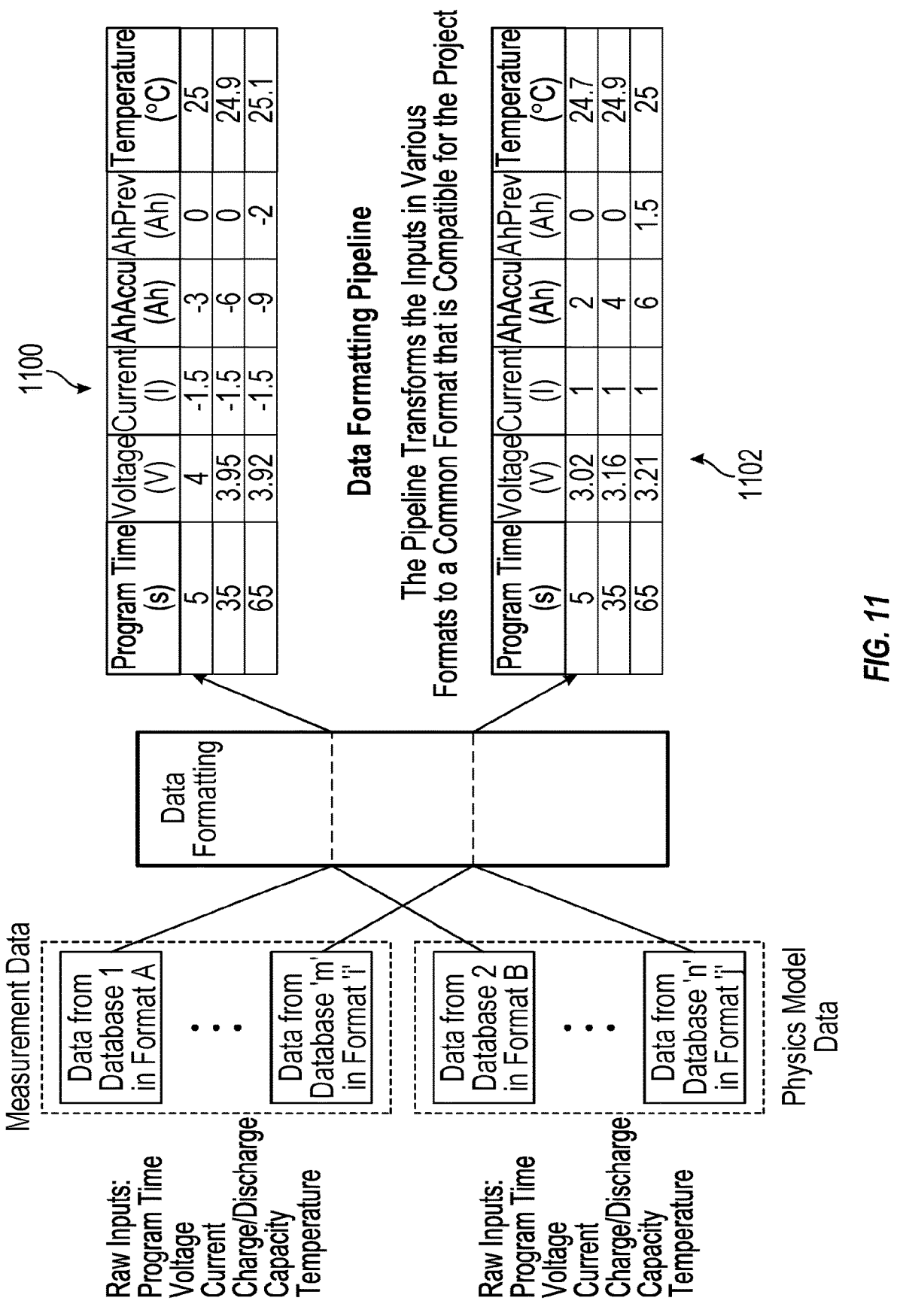
FIG. 11 illustrates an example of data formatting according to certain embodiments of this disclosure.

FIG. 11 illustrates an example of data formatting according to certain embodiments of this disclosure. External raw data comes in different formats and synthetic data created with the external simulation model are combined by bringing them into a common format suitable for the machine learning model 132. Thus data standardization is ensured in all processing stages. As depicted, raw inputs for measurement data may include program time, voltage, current, charge/discharge, capacity, and temperature, and they are stored as data from database 1 in format A. The raw inputs for the physics model data include program time, voltage, current, charge/discharge, capacity, and temperature, and they are stored as data from database 2 in format B. The data from database 1 and 2 stored in formats A and B (e.g., different formats), respectively, are formatted into a common format as depicted in tables 1100 and 1102.

Figure 12:
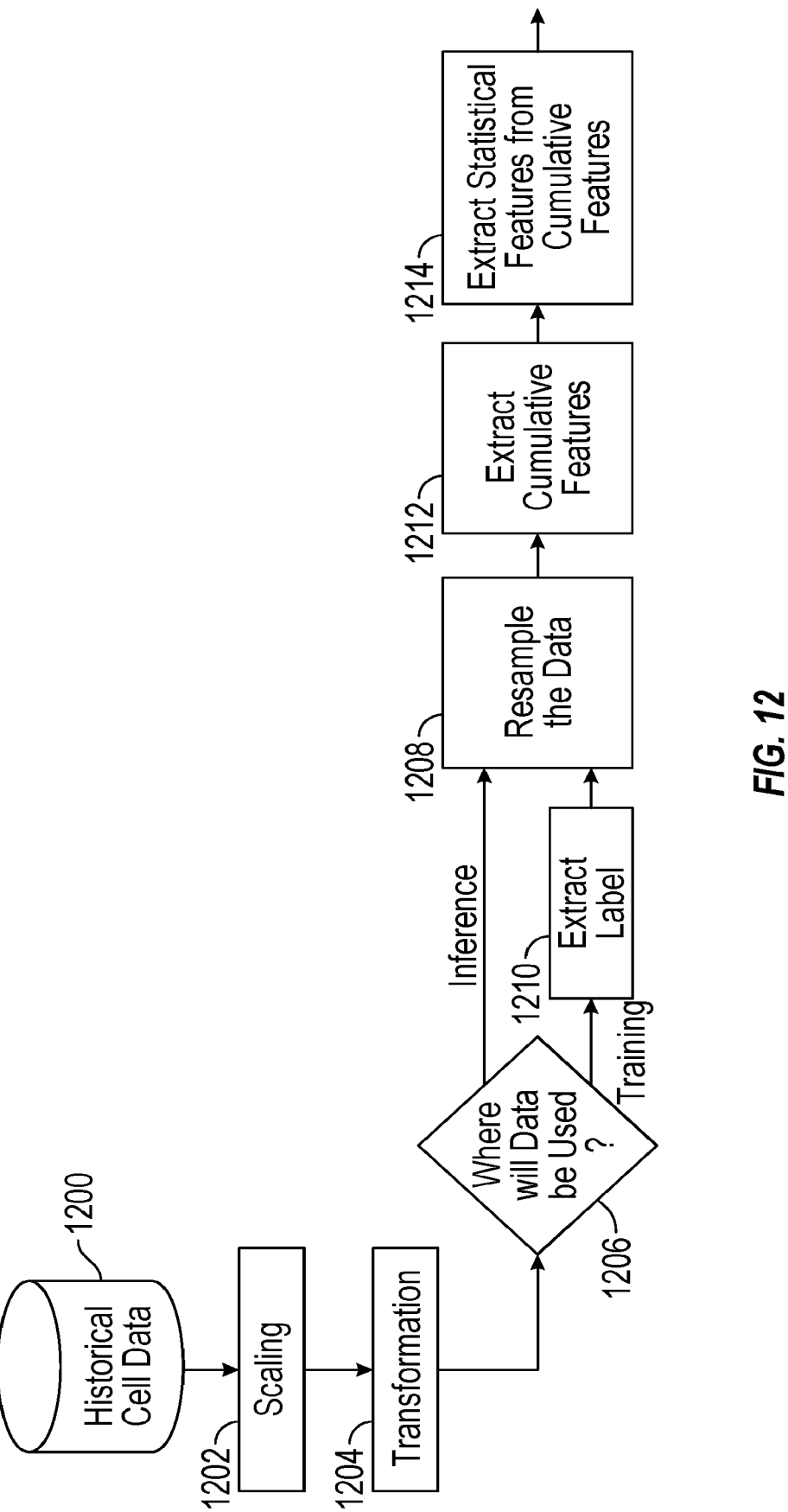
FIG. 12 illustrates an example data pre-processing pipeline according to certain embodiments of this disclosure.

FIG. 12 illustrates an example data pre-processing pipeline according to certain embodiments of this disclosure. Following a formatting stage and stored as historical data 1200, the data is then scaled 1202 to enable higher performance processing. One method is automatically selected from following methods that is most suitable for the data. In some embodiments, additional scaling methods could be added for automatic selection. Rule based selection process is applied. Criteria for automatic selection is as follows:

If data set does not have negative values and outliers, MinMax scaling is used. If data set does not have outliers but has negative values Standard Scaling is used. If data set has outliers Robust scaling is used. In data sets that has fewer outliers, RobustScaling is used to remove outliers and Min-Max Scaling is used if data set does not have negative values. Otherwise Standard Scaling is used. This rule based simple selection method is useful to achieve enhanced performance with the available data.

Min-Max Scaling: transforms features by scaling each feature to a given range. It scales and translates each feature individually such that it is in the given range on the dataset, e.g. between zero and one.

$$x_i' = \frac{x_i - \min(x)}{\max(x) - \min(x)}$$

Standard Scaling: standardization is another scaling technique where the values are centered around the mean with a unit standard deviation. This means that the mean of the attribute becomes zero and the resultant distribution has a unit standard deviation.

$$x_{stand_i} = \frac{x_i - \text{mean}(x)}{\text{standard deviation}(x)}$$

Robust Scaling: Standardizes input variables in the presence of outliers is to ignore the outliers from the calculation of the mean and standard deviation, then use the calculated values to scale the variable.

$$x_i' = \frac{x_i - \text{median}(x)}{(Q3 - Q1)}$$

Where
x'$_i$=robust standardized value
x$_i$=original value
median(x)=sample median
(Q3–Q1)=interquartile range Following scaling, data is transformed. Transformation compresses data reducing size, increasing data quality, making it better-organized and more-Gaussian distribution.

After staging, then transformation 1204 is performed. One transform method is automatically chosen from list below. In some embodiments, additional transformation methods may be used. Criteria for transform selection may be based on a method that provides a closest resemblance to Gaussian distribution.

Quantile Transformation: quantile transforms are a technique for transforming numerical input or output variables to have a Gaussian or uniform probability distribution.

Box-Cox Transformation: a Box-Cox transformation is a transformation of non-normal dependent variables into a normal shape. Normality is an important assumption for many statistical techniques; if your data isn't normal, applying a Box-Cox means that you are able to run a broader number of tests.

$$y_i^{(\lambda)} = \begin{cases} \dfrac{y_i^{(\lambda)} - 1}{\lambda} & \text{if } \lambda \neq 0, \\ \ln(y_i) & \text{if } \lambda = 0, \end{cases}$$

Yeo-Johnson Transformation: is also called power transformation. In statistics, a power transform is a family of functions applied to create a monotonic transformation of data using power functions. It is a data transformation technique that may be used to stabilize variance, make the data more normal distribution-like, improve the validity of measures of association (such as the Pearson correlation between variables), and for other data stabilization procedures.

$$\varphi(y, \lambda) = \begin{cases} \dfrac{(y+1)^\lambda - 1}{\lambda} & y \geq 0 \text{ and } \lambda \neq 0 \\ \log(y+1) & y \geq 0 \text{ and } \lambda \neq 0 \\ \dfrac{(-y+1)^{2-\lambda} - 1}{2 - \lambda} & y < 0 \text{ and } \lambda \neq 2 \\ -\log(-y+1) & y < 0, \lambda = 2 \end{cases}$$

A determination 1206 is made of where data is going to be used. If in 'Training', then 'labels' are extracted from data 1210. If it is going to be used in 'Inference', data moves straight to 'Resample' phase 1208. Resampling ensures that the model may be robust enough to handle variations in data. At 1212, the processing device extracts cumulative features, and at 1214, the processing device extracts statistical features from cumulative features.

Figure 13:
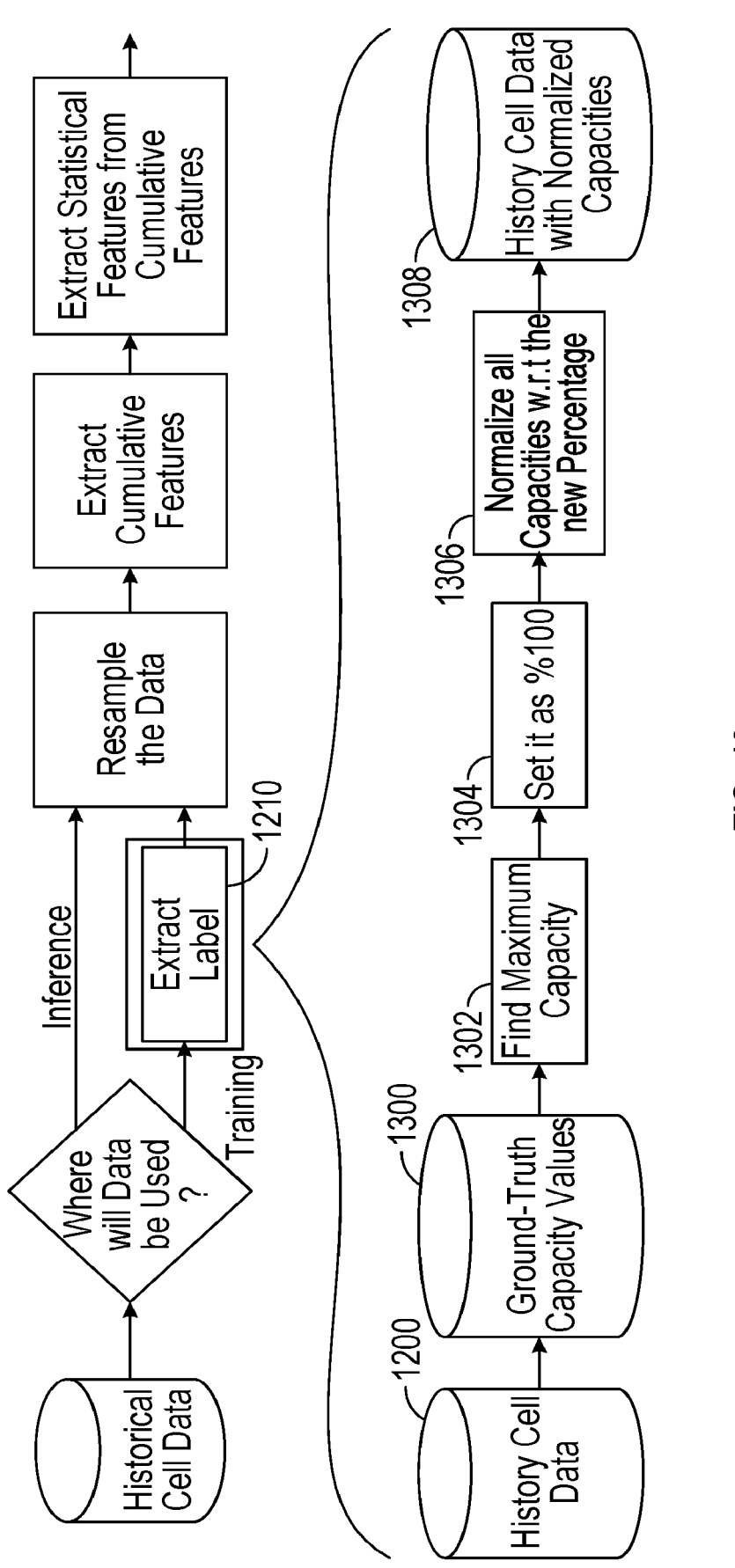
FIG. 13 illustrates an example label extraction pipeline according to certain embodiments of this disclosure.

FIG. 13 illustrates an example label extraction pipeline according to certain embodiments of this disclosure. The ground-truth capacity values 1300 are obtained from the history cell data 1200. The maximum capacity value 1302 is found by traversing through the actual capacity values of the data. Assuming this value is 100% (1304), all other values are proportioned according to this value (normalized at 1306). Thus, the capacity is expressed in percentage. Cell data with normalized capacities 1308 is stored to a dataset.

Figure 14:
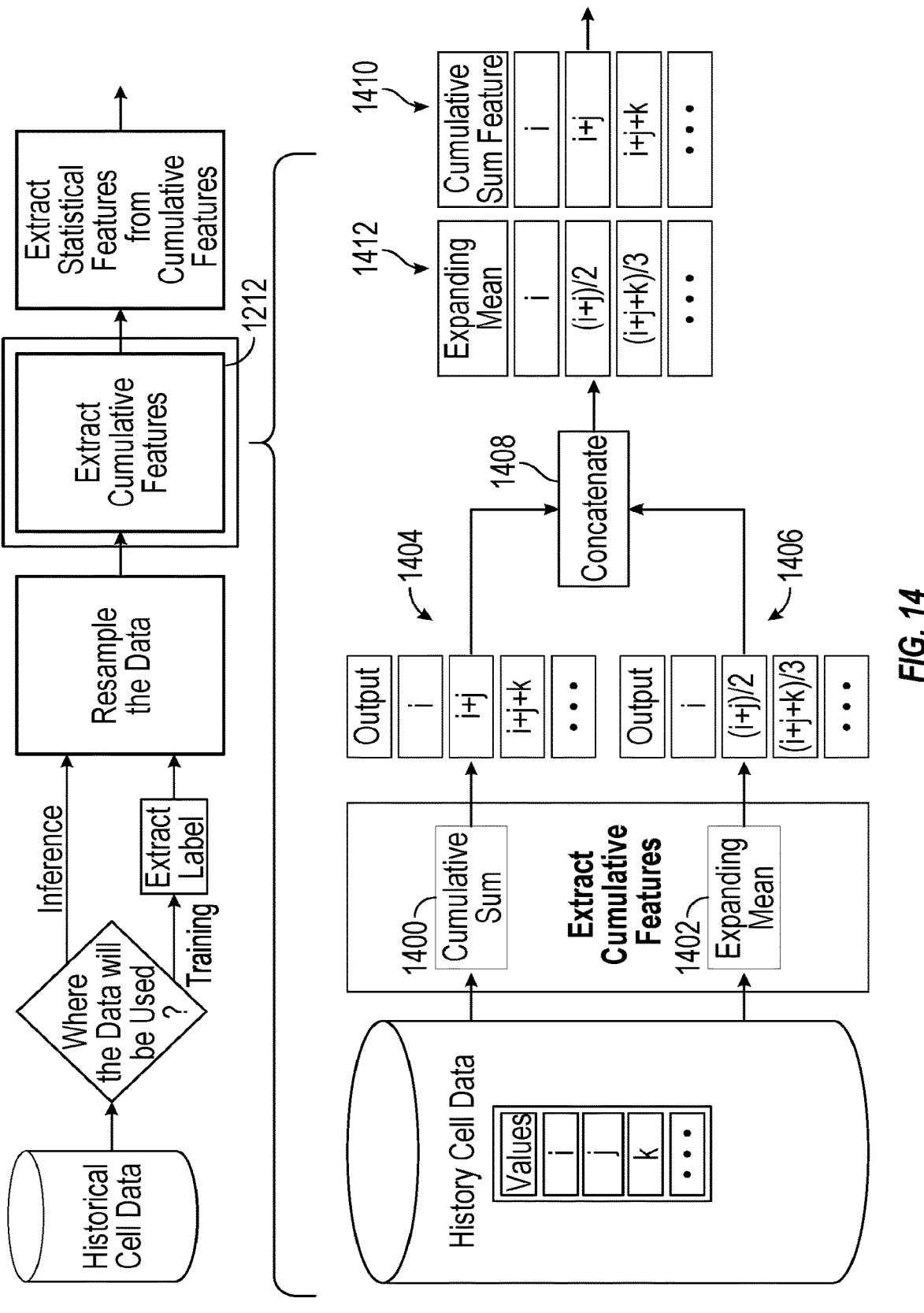
FIG. 14 illustrates an example of cumulative feature extraction according to certain embodiments of this disclosure.

FIG. 14 illustrates an example of cumulative feature extraction 1212 according to certain embodiments of this disclosure. Cumulative features are extracted from the data. Cumulative Sum 1400 and Expanding Mean 1402 are calculated in parallel and values 1404 and 1406 are then concatenated 1408. Each cell is populated with the cumulative sum of the values seen so far producing cumulative sum in table 1410.

$$\Sigma_i^N x_i$$

Expanding mean calculates the row-wise expanding mean of the values shown in the cell of table 1412:

$$\frac{\sum_i^N x_i}{N}$$

Figure 15:
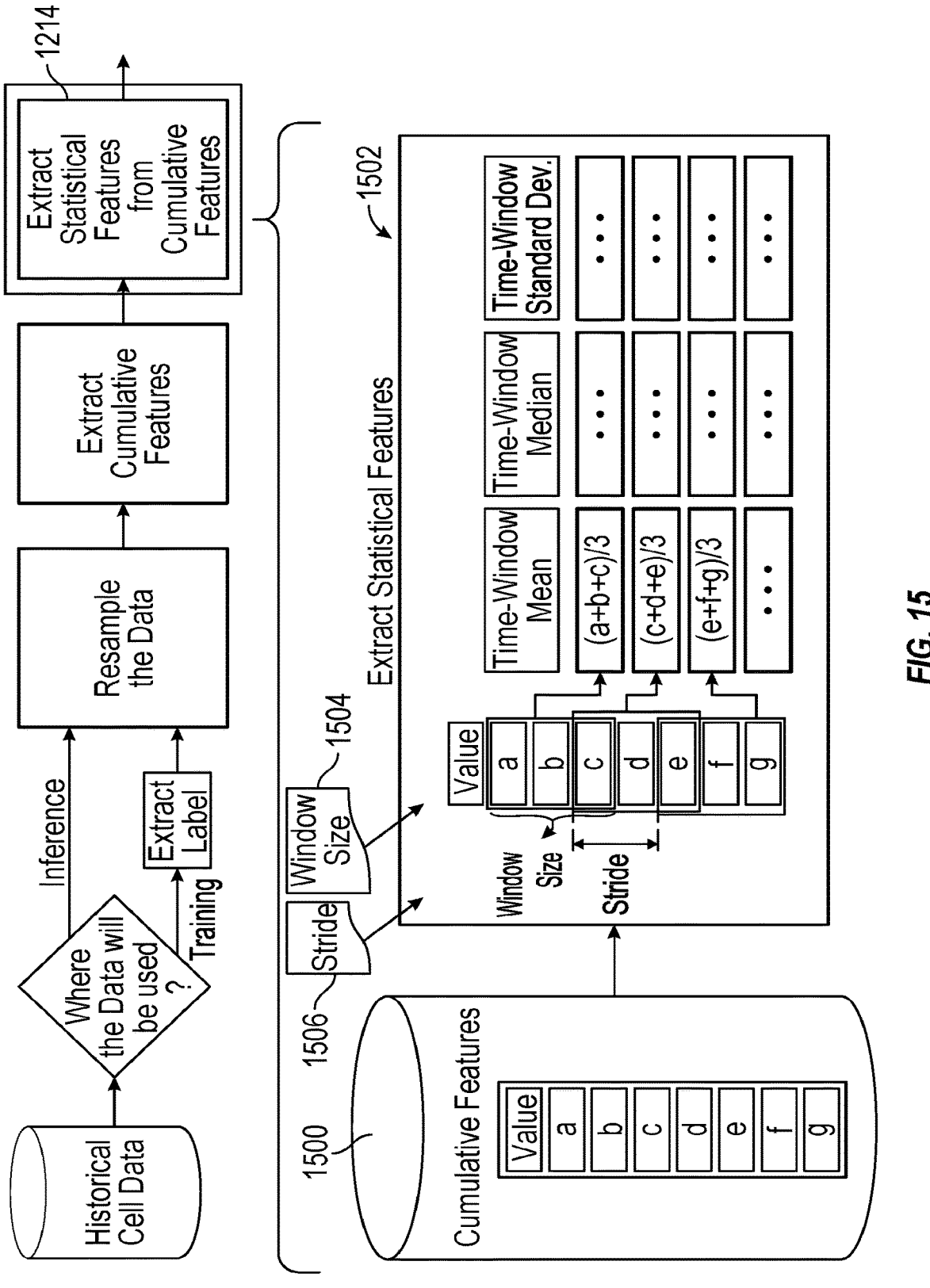
FIG. 15 illustrates an example of statistical feature extraction according to certain embodiments of this disclosure.

FIG. 15 illustrates an example of statistical feature extraction according to certain embodiments of this disclosure. Statistical Feature Extraction 1502 can be described as 'low loss dimension reduction'. Statistical features are extracted from cumulative features 1500. This is done because the data frequency may be high, and the temporally close values do not differ much. A stride 1506 and window size 1504 are configured to use to extract features. By extracting statistics with the time-window approach, the temporal resolution is reduced and more stable values are produced.

Figure 16:
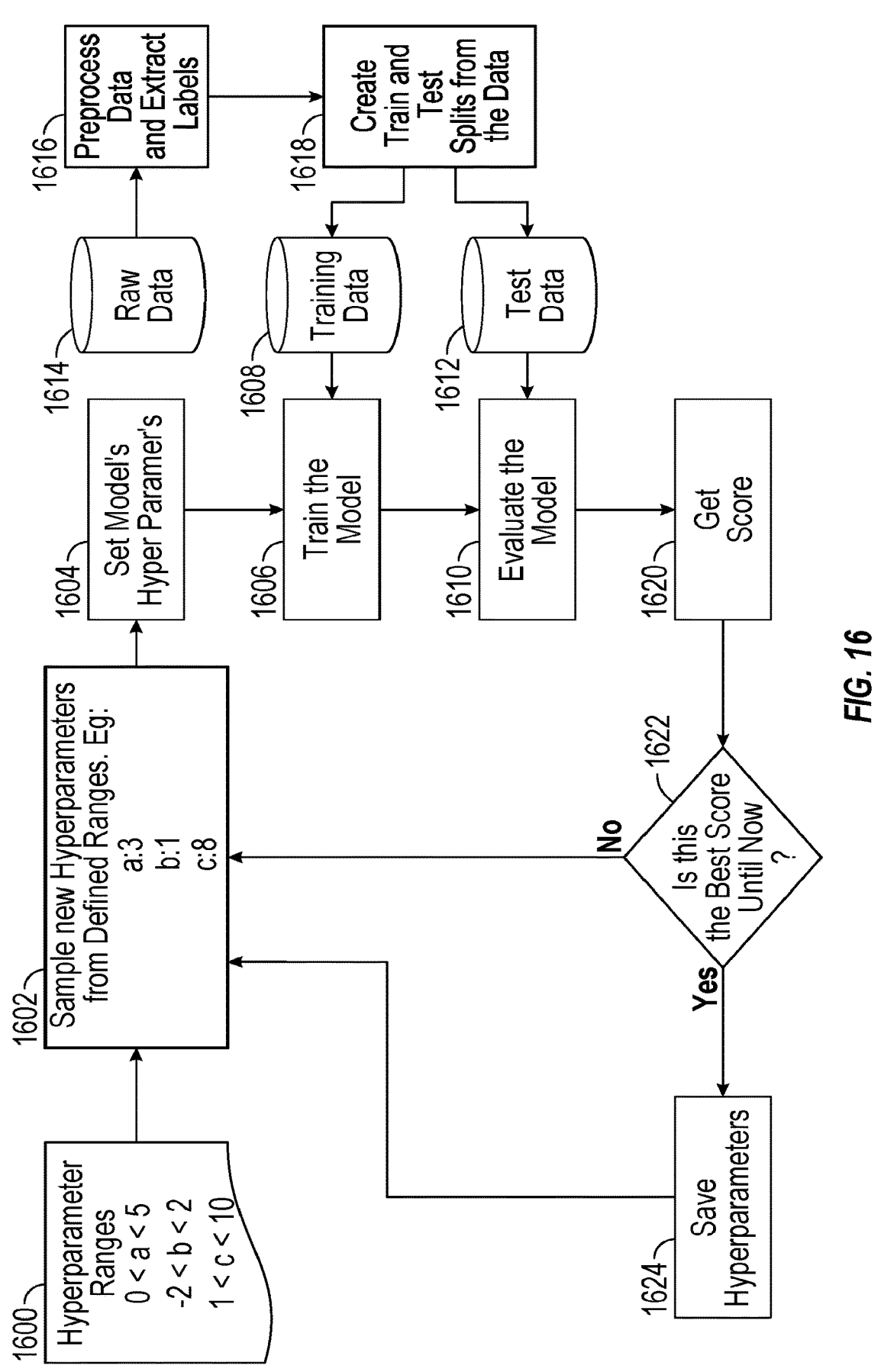
FIG. 16 illustrates example operations that find optimal hyperparameters for the machine learning model according to certain embodiments of this disclosure.

FIG. 16 illustrates example operations that find optimal hyperparameters for the machine learning model according to certain embodiments of this disclosure. The maximum and minimum values that various hyperparameters can take are determined for the machine learning model 132. Random parameters 1602 are sampled from these intervals 1600, the machine learning model's parameters are set 1604 and the machine learning model 132 is trained 1606 on the training data 1608 according to these parameters and evaluated 1610 in the test data 1612.

Raw data 1614 is obtained (e.g., cell, voltage, temperature, user battery usage profile, etc.). At 1616, the raw data is preprocessed and labels are extracted. At 1618, training data 1608 and test data 1612 splits are created 1618 from the preprocessed data and extracted labels. If (1622) the evaluation result is the best result so far depending on getting the score 1620, the current hyperparameters are saved 1624. The process continues by sampling new hyperparameters until reaching the determined loop limit. In other words, the process continues until a new best score cannot be found for any combination of hyperparameters. Those hyperparameters with the best score out of all the scores are used for the machine learning model 132.

Value of hyperparameters may be used to control the learning process. Many ML models have important parameters which cannot be directly estimated from the data. A type of model parameter is referred to as a tuning parameter when it cannot be directly estimated from the data because there may not be an analytical formula available to calculate an appropriate value. In some embodiments, new hyperparameters are sampled from pre-defined ranges, the machine learning model is evaluated, and a new set of hyperparameters are tested until desired accuracy is reached.

K-Fold Cross Validation: Cross-validation is a resampling procedure used to evaluate machine learning models on a limited data sample. The procedure has a single parameter called k that refers to the number of groups that a given data sample is to be split into. As such, the procedure is often called k-fold cross-validation. When a specific value for k is chosen, it may be used in place of k in the reference to the model, such as k=10 becoming 10-fold cross-validation.

Group K-Fold Cross Validation: K-fold iterator variant with non-overlapping groups. The same group will not appear in two different folds (the number of distinct groups has to be at least equal to the number of folds). The folds are approximately balanced in the sense that the number of distinct groups is approximately the same in each fold.

Figure 17:
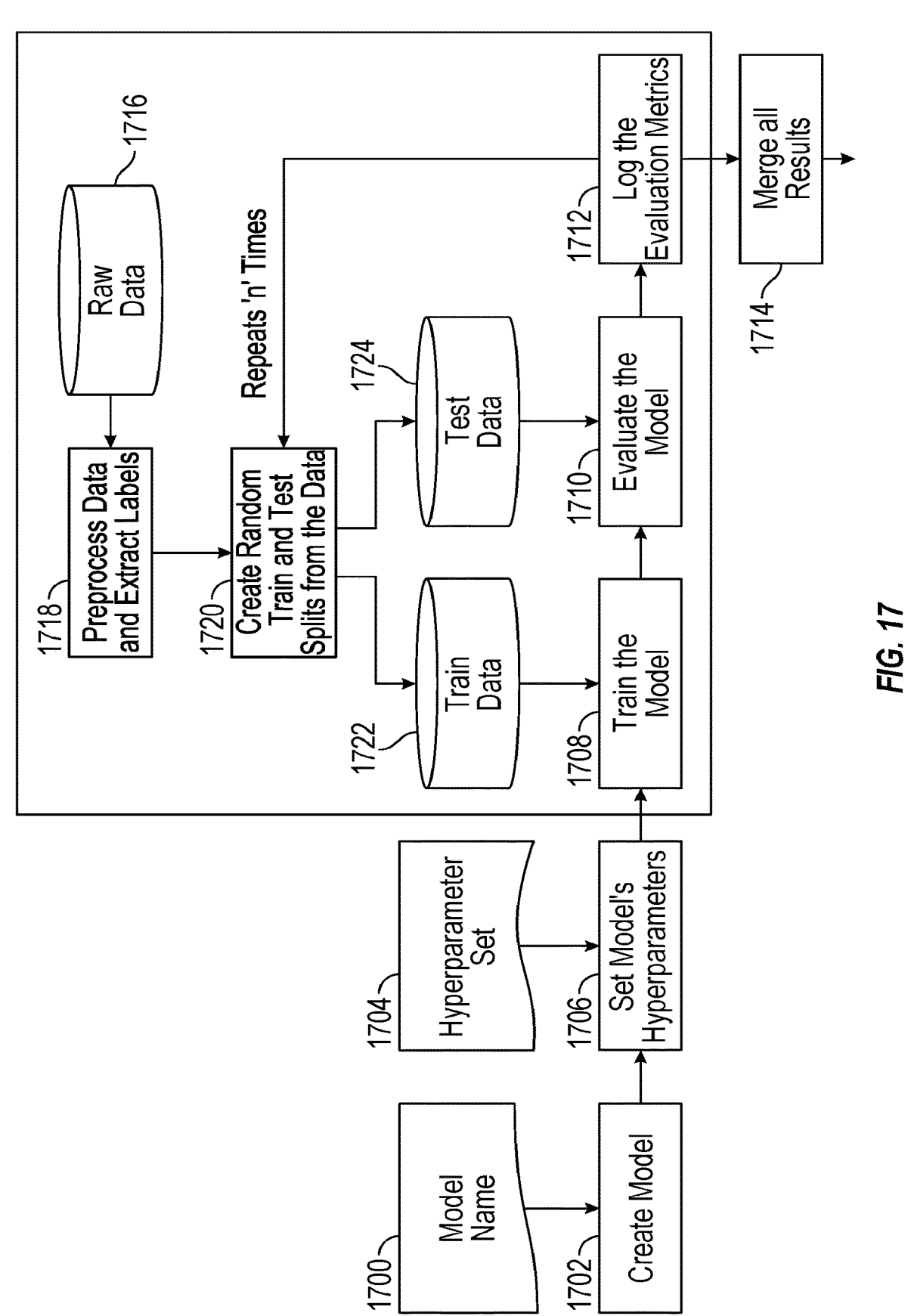
FIG. 17 illustrates example operations that evaluate the machine learning model based on a dynamic test data according to certain embodiments of this disclosure.

FIG. 17 illustrates example operations that evaluate the machine learning model based on a dynamic test data according to certain embodiments of this disclosure. A machine learning model is provided a name 1700. A machine learning model 132 is created 1702 with the best hyper-parameter set 1704 obtained from the optimization process. The model's hyperparameters are set 1706.

Raw data 1716 is used during preprocessing and extracting of labels 1718. Random training data 1722 and test data 1724 splits from the data are created 1720. The data is randomly split 'n' times into training and testing. The model is trained 1708 and tested 'n' times on these splits. The performance of the model is evaluated 1710 over the resultant metrics of 'n' results. The evaluation metrics are logged 1712. At 1714, the results of the iterations are merged.

Figure 18:
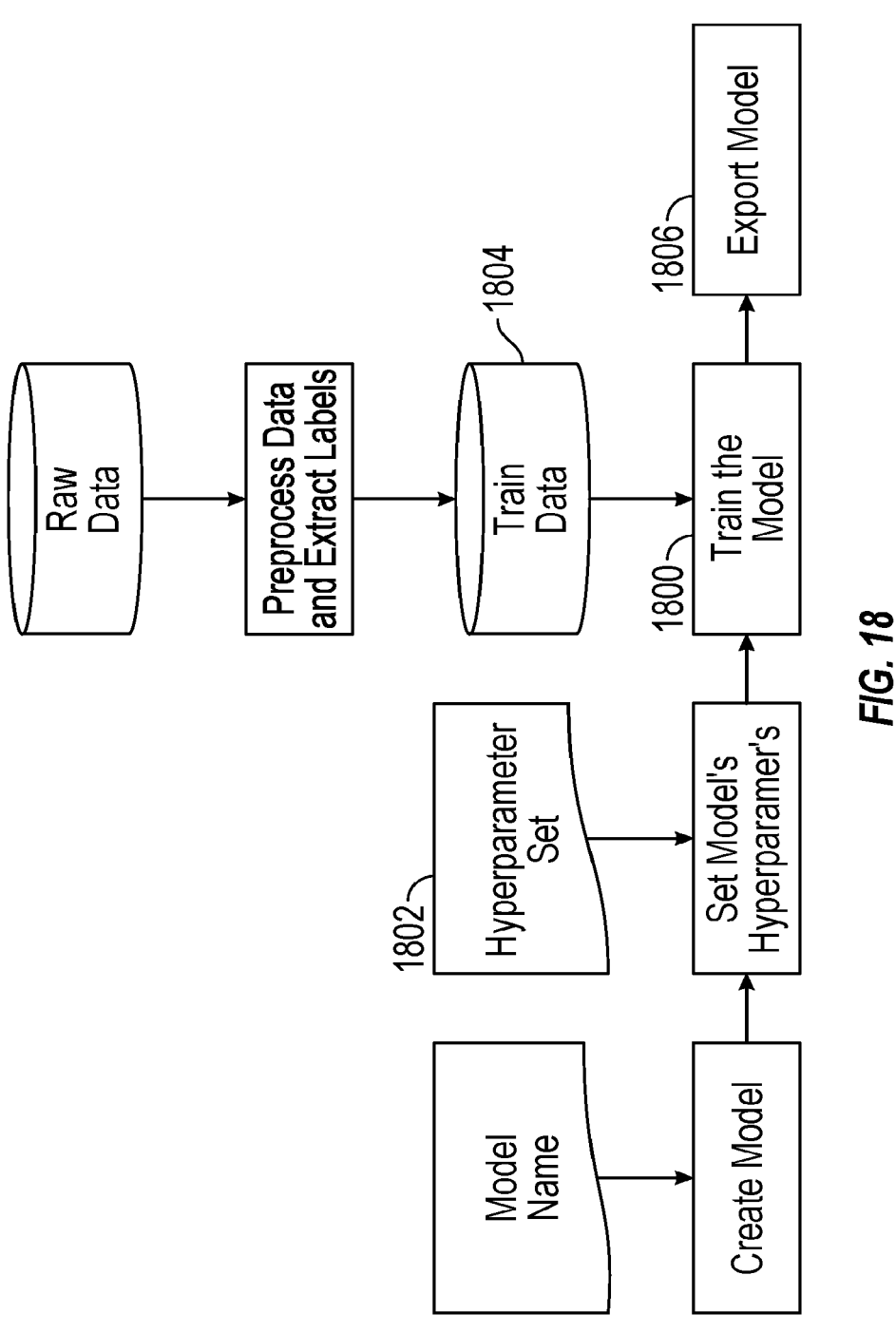
FIG. 18 illustrates example operations that train the machine learning model using a full set of data according to certain embodiments of this disclosure.

FIG. 18 illustrates example operations that train the machine learning model using a full set of data according to certain embodiments of this disclosure. If the results are found to be sufficiently good in the evaluation stage, the final training stage 1800 of the model is started. The model is created with the best available hyper-parameter set 1802 and trained on all data 1804. This time, train and test splits are not created from the data, all of the data are used for training. The trained model is saved 1806.

Example machine learning models may include:

LightGBM: is short for Light Gradient Boosting Machine and is based on decision tree algorithms and used for ranking, classification and other machine learning tasks. Gradient One-Sided Sampling [GOSS] utilizes every instance with a larger gradient and does the task of random sampling on the various instances with the small gradients. The training dataset is given by the notation of O for each particular node of the Decision tree. The variance gain of j or the dividing measure at the point d for the node is given by:

$$\tilde{V}_j(d) =$$

$$\frac{1}{n}\left[ \frac{\left(\sum_{x_i\in A_l}g_i + \frac{1-a}{b}\sum_{x_i\in B_l}g_i\right)^2}{n_l^j(d)} + \frac{\left(\sum_{x_i\in A_r}g_i + \frac{1-a}{b}\sum_{x_i\in B_r}g_i\right)^2}{n_r^j(d)} \right]$$

Where
$A_l=\{Xi\in A:Xij\leq d\}$,
$A_r=\{Xi\in A:Xij>d\}$,
$B_l=\{Xi\in B:Xij\leq d\}$,
$B_r=\{Xi\in B:Xij>d\}$
And the coefficient $$\frac{1-a}{b}$$

is used to normalize the sum of gradients over B back to size of $A^C$.

CatBoost: An algorithm for gradient boosting on decision trees. It is used for search, recommendation systems, personal assistant, self-driving cars, weather prediction and many other tasks.

XGBoost: More regularized form of Gradient Boosting. XGBoost uses advanced regularization (L1 & L2), which improves model generalization capabilities. XGBoost delivers high performance as compared to Gradient Boosting. Its training is very fast and can be parallelized/distributed across clusters.

L1 regularization is best suited to data sets with high number of features as it provides sparse solutions. There is also a computational advantage as features with zero coefficients can be avoided.

L2 regularization can deal with the multicollinearity [independent variables are highly correlated] problems through constricting the coefficient and by keeping all the variables. L2 regression can be used to estimate the significance of predictors by penalizing the insignificant predictors.

Linear Regression: It fits a linear model with coefficients to minimize the residual sum of squares between the observed targets in the dataset, and the targets predicted by the linear approximation.

Lasso Regression: Linear Model trained with L1 prior as regularizer (aka the Lasso).

Ridge Regression: Linear least squares with L2 regularization.

ElasticNet: Linear regression with combined L1 and L2 priors as regularizer.

Ordinary Least Square Linear Regression [OLSLR]:

Ordinary least squares, or linear least squares, estimates the parameters in a regression model by minimizing the sum of the squared residuals. This method draws a line through the data points that minimizes the sum of the squared differences between the observed values and the corresponding fitted values.

RNN: A recurrent neural network (RNN) is a class of artificial neural networks where connections between nodes form a directed or undirected graph along a temporal sequence. This allows it to exhibit temporal dynamic behaviour. Derived from feedforward neural networks, RNNs can use their internal state (memory) to process variable length sequences of inputs.

LSTM: Long short-term memory (LSTM) is an artificial recurrent neural network (RNN) architecture used in the field of deep learning. Unlike standard feedforward neural networks, LSTM has feedback connections. It can process not only single data points like images, but also entire sequences of data sets like speech or video. LSTM is used to eliminate the gradient explosion and gradient disappearance problems in the RNN network.

The units of an LSTM are used as building units for the layers of a RNN, often called an LSTM network. LSTMs enable RNNs to remember inputs over a long period of time. This is because LSTMs contain information in a memory like the memory of a computer. The LSTM can read, write and delete information from its memory. This memory may be akin to a gated cell, with gated meaning the cell decides whether to store or delete information (i.e., if it opens the gates or not), based on the importance it assigns to the information. The assigning of importance happens through weights, which are also learned by the algorithm. This simply means that it learns over time what information is important and what is not.

In an LSTM there are three gates: input, forget and output gate. These gates determine whether to let new input in (input gate), delete the information because it isn't important (forget gate), or let it impact the output at the current timestep (output gate).

The gates in an LSTM are analog in the form of sigmoids, meaning they range from zero to one. The fact that they are analog enables them to do backpropagation.

GRU: Gated recurrent units (GRUs) are a gating mechanism in recurrent neural networks. The GRU is like a long short-term memory (LSTM) with a forget gate, but has fewer parameters than LSTM, as it lacks an output gate. It performs faster.

Mean Absolute Error:

$$MAE = \frac{1}{n}\sum_{i=0}^{n}|y_i - \hat{y}_i|$$

In statistics, mean absolute error (MAE) is a measure of errors between paired observations expressing the same phenomenon. Examples of Y versus X include comparisons of predicted versus observed, subsequent time versus initial time, and one technique of measurement versus an alternative technique of measurement.

Mean Absolute Percentage Error:

$$MAE = \frac{100\%}{n}\sum_{i=0}^{n}\left|\frac{y_i - \hat{y}_i}{y_i}\right|$$

The mean absolute percentage error (MAPE) is a measure of how accurate a forecast system is. It measures this accuracy as a percentage, and can be calculated as the average absolute percent error for each time period minus actual values divided by actual values.

Maximum Error:

$$max(|y_i - \hat{y}_i|)$$

The maximum difference between the point estimate and the actual parameter

Root Mean Square Error [RMSE]:

$$RMSE = \sqrt{\sum_{i=0}^{n}\frac{(\hat{y}_i - y_i)^2}{n}}$$

RMSE is the standard deviation of prediction errors, Residuals. Residuals are a measure of how far from the regression line data points are; RMSE is a measure of how spread out these residuals are. In other words, it tells you how concentrated the data is around the line of best fit.

R2 Score:

$$R^2 = 1 - \frac{RSS}{TSS}$$

R2 score measures the amount of variance in the predictions of dataset. It is best suited to evaluate the performance of a regression-based machine learning model.

Figure 19:
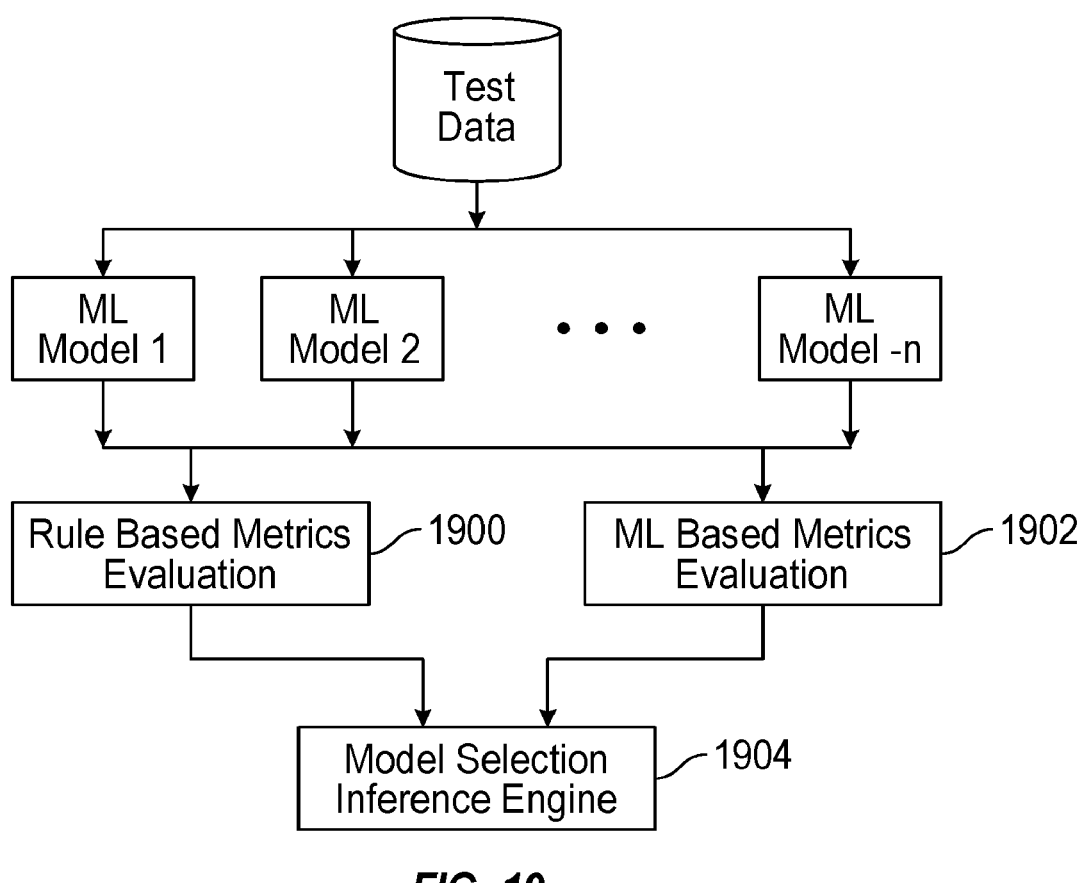
FIG. 19 illustrates example operations that select a desired machine learning model based on metrics according to certain embodiments of this disclosure.

RSS=Sum of Squares of Residuals
TSS=Total Sum of Squares
FIG. 19 illustrates example operations that select a desired machine learning model based on metrics according to certain embodiments of this disclosure;

Most recent test data is used for evaluating trained ML Models. Test data is fed to a number of ML models. Results such as evaluation metrics are then supplied to 'Rule Based Evaluator' 1900 and 'ML Based Evaluator' 1902. Rule based evaluator 1900 chooses best machine learning model on user defined metric weights. 'ML Based Evaluator' 1902 chooses best ML model using metrics and historical performance of machine learning models on similar data sets. Finally 'Model Selection Inference Engine' 1904 chooses a desired (e.g., "best") machine learning model using results supplied by Rule Based Evaluator 1900 and Model Selection Inference Engine 1904. Model Selection Inference Engine 1904 has a user defined weights for each evaluator branch.

Figure 20:
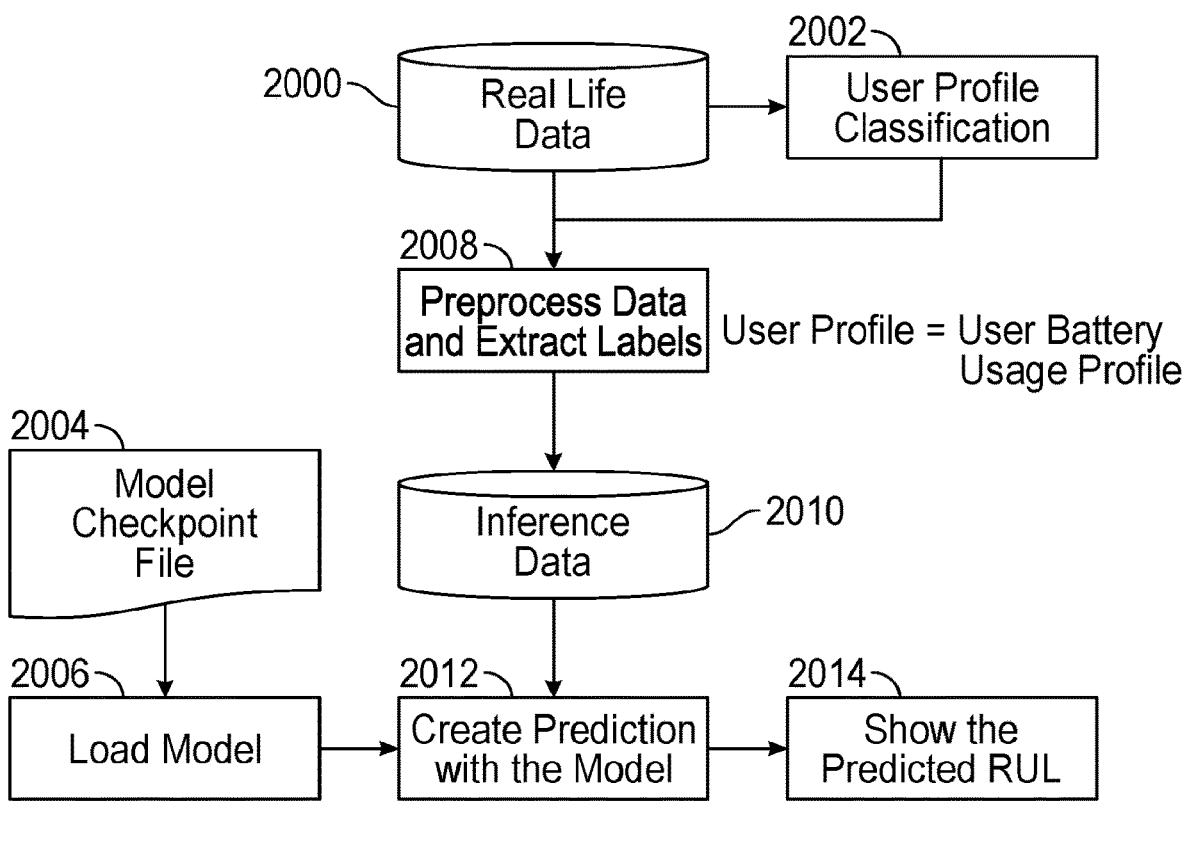
FIG. 20 illustrates example operations that predict a remaining useful life of an asset based on real data for according to certain embodiments of this disclosure.

FIG. 20 illustrates example operations that predict a remaining useful life of an asset based on real data 2000 (e.g., sensor measurements for cell current, cell voltage, cell temperature, etc.) for according to certain embodiments of this disclosure. The real life data 2000 is used for user profile classification 2002 (user battery usage profile) and the real life data and the user profile classification are used as inputs to preprocessing and extraction of labels 2008. Selected trained model 2004 is loaded 2006 from or into memory at the BMS hardware and/or processing device of the vehicle 2117. Real-time data is made compatible with the model by passing through the pre-process stage to create inference data 2010. The processed data contains physics-based model data model data, SEI, as well. RUL Prediction is produced by feeding the processed data to the model 2012. The predicted estimated RUL value is shown to the user 2014.

Figure 21:
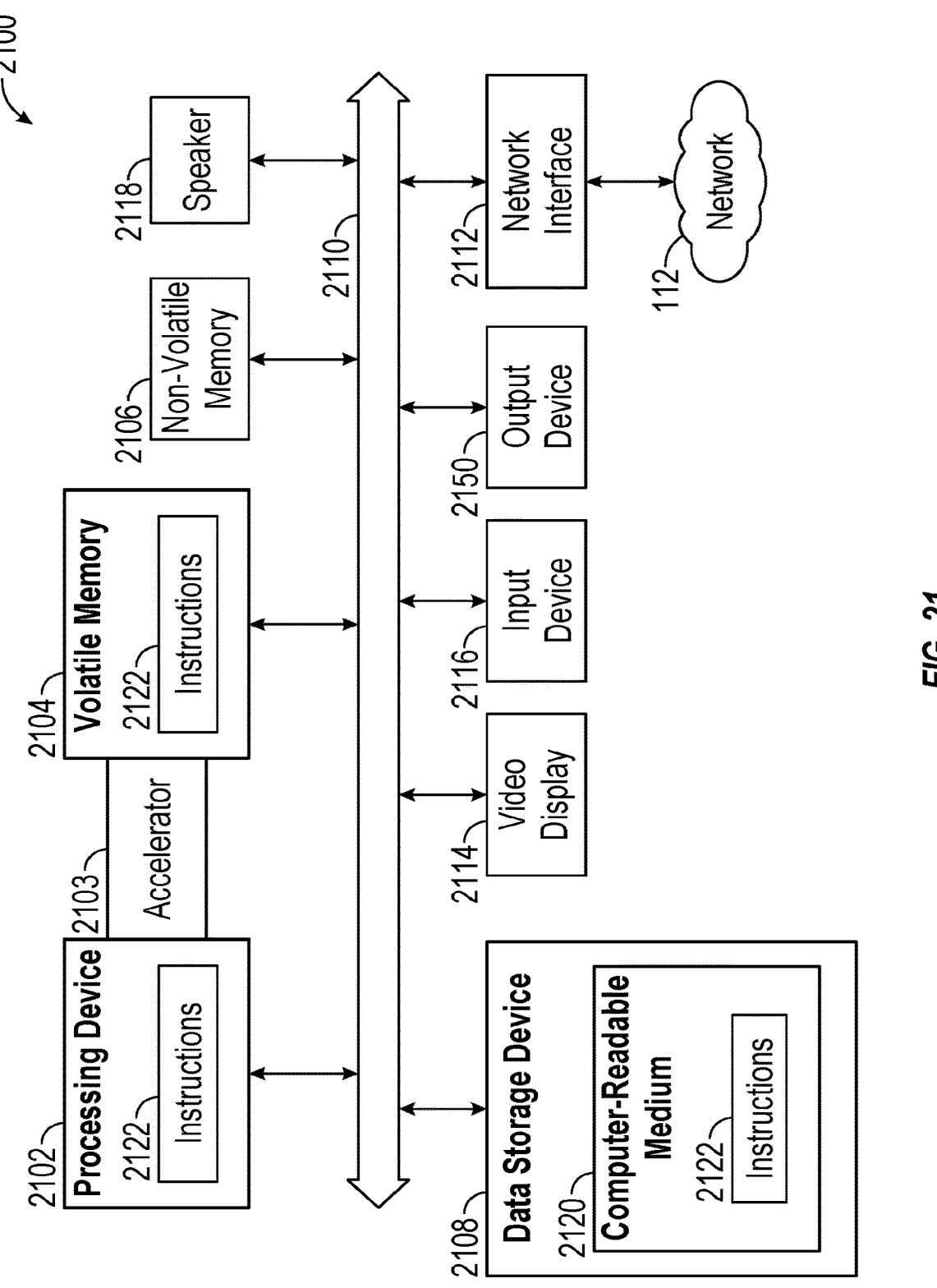
FIG. 21 illustrates an example computer system according to certain embodiments of this disclosure.

FIG. 21 illustrates example computer system 2100 which can perform any one or more of the methods described herein, in accordance with one or more aspects of the present disclosure. In one example, computer system 2100 may correspond to the computing device 102 (e.g., user computing device), computing device 103, one or more servers 128 of the cloud-based computing system 116, the training engine 130, any component of the vehicle 117, or any suitable component of FIG. 1. The computer system 2100 may be capable of executing physics-based model 600 and/or the one or more machine learning models 132 of FIG. 1. The computer system may be connected (e.g., networked) to other computer systems in a LAN, an intranet, an extranet, or the Internet. The computer system may operate in the capacity of a server in a client-server network environment. The computer system may be a personal computer (PC), a tablet computer, a wearable (e.g., wristband), a set-top box (STB), a personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The computer system 2100 includes a processing device 2102, a volatile memory 2104 (e.g., random access memory (RAM)), a non-volatile memory 2106 (e.g., read-only memory (ROM), flash memory, solid state drives (SSDs), and a data storage device 2108, the foregoing of which are enabled to communicate with each other via a bus 2110.

Processing device 2102 represents one or more general-purpose processing devices such as a microprocessor, central processing unit, or the like. More particularly, the processing device 2102 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 2102 may also be one or more special-purpose processing devices such as an application specific integrated circuit (ASIC), a system on a chip, a field programmable gate array (FPGA), a digital signal processor (DSP), network processor, or the like. The processing device 2102 may include more than one processing device, and each of the processing devices may be the same or different types. The processing device 2102 may include or be communicatively coupled to one or more accelerators 2103 configured to offload various data-processing tasks from the processing device 2102. The processing device 2102 is configured to execute instructions for performing any of the operations and steps discussed herein.

The computer system 2100 may further include a network interface device 2112. The network interface device 2112 may be configured to communicate data via any suitable communication protocol. In some embodiments, the network interface devices 2112 may enable wireless (e.g., WiFi, Bluetooth, ZigBee, etc.) or wired (e.g., Ethernet, etc.) communications. The computer system 2100 also may include a video display 2114 (e.g., a liquid crystal display (LCD), a light-emitting diode (LED), an organic light-emitting diode (OLED), a quantum LED, a cathode ray tube (CRT), a shadow mask CRT, an aperture grille CRT, or a monochrome CRT), one or more input devices 2116 (e.g., a keyboard or a mouse), and one or more speakers 2118 (e.g., a speaker). In one illustrative example, the video display 2114 and the input device(s) 2116 may be combined into a single component or device (e.g., an LCD touch screen).

The output device 2150 may transmit and receive data from a computer system application programming interface (API). The data may pertain to any suitable information described herein, such as a remaining useful life of a battery pack, among other information.

The data storage device 2108 may include a computer-readable medium 2120 on which the instructions 2122 embodying any one or more of the methods, operations, or functions described herein is stored. The instructions 2122 may also reside, completely or at least partially, within the volatile memory 2104 or within the processing device 2102 during execution thereof by the computer system 2100. As such, the volatile memory 2104 and the processing device 2102 also constitute computer-readable media. The instructions 2122 may further be transmitted or received over a network via the network interface device 2112.

While the computer-readable storage medium 2120 is shown in the illustrative examples to be a single medium, the term "computer-readable storage medium" should be taken to include a single medium or multiple media (e.g., a centralized or distributed database, or associated caches and servers) that store the one or more sets of instructions. The term "computer-readable storage medium" shall also be taken to include any medium capable of storing, encoding, or carrying a set of instructions for execution by the machine, where such set of instructions cause the machine to perform any one or more of the methodologies of the present disclosure. The term "computer-readable storage medium" shall accordingly be taken to include, but not be limited to, solid-state memories, optical media, and magnetic media.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle.

Consistent with the above disclosure, the examples of systems and method enumerated in the following clauses are specifically contemplated and are intended as a non-limiting set of examples.

1. A computer-implemented method for a processing device included in a vehicle, wherein the computer-implemented method comprises:

receiving first data pertaining to a battery pack of a vehicle, wherein the first data is received from one or more sensors associated with the vehicle, and the first data pertains to a battery pack current, a cell voltage, a cell current, a cell temperature, or some combination thereof;

receiving second data pertaining to simulation of the battery pack when sensor data is missing;

receiving third data pertaining to the battery pack from a manufacturer of the battery pack;

receiving fourth data pertaining to lab experiments data associated with the battery pack;

receiving historical data on a fleet of vehicles that use the battery pack;

predicting, based on the first, second, third, fourth, and historical data, a remaining useful life of each cell of the battery pack of the vehicle by using a hybrid model, wherein the hybrid model comprises:

a physics-based model configured to receive the data, and to generate one or more properties pertaining to the battery pack of the vehicle;

a machine learning model configured to use at least the one or more properties to predict the remaining useful life of each cell of the battery pack; and transmitting the remaining useful life of each cell of the battery pack for presentation on a user interface of a computing device or to be further processed by another computer device.

2. The computer-implemented method of any preceding clause, further comprising:

receiving fifth data comprising a user battery usage profile comprising at least one of information pertaining to acceleration, deceleration, braking, mileage in a given time period, frequency of battery pack charging, type of battery pack charging, and speed; and using the fifth data to predict the remaining useful life of each cell of the battery pack.

3. The computer-implemented method of any preceding clause, wherein the one or more properties comprise an internal state of the battery pack and/or cell including over-potentials related to an electrode, a loss of cyclable lithium, a loss of active material, a change in solid electrolyte interphase thickness, a state of health, a capacity loss, a resistance increase due to degradation, or some combination thereof.

4. The computer-implemented method of any preceding clause, further comprising transmitting the remaining useful life of each cell of the battery pack as a number of full cycles left to be used before the battery pack reaches an end of life state.

5. The computer-implemented method of any preceding clause, further comprising receiving machine learning model and its parameters from a cloud-based computing system.

6. The computer-implemented method of any preceding clause, wherein a cloud-based computing system trains the machine learning model by optimizing one or more hyper-parameters in an iterative process and transmits machine learning model parameters to the processing device of the vehicle prior to the data being received to predict the remaining useful life of each cell of the battery pack.

7. The computer-implemented method of any preceding clause, further comprising, based on the remaining useful life, performing a preventative action, wherein the preventative action comprises causing an operating parameter of the vehicle to change to consume less charge of the battery pack, change cells in some battery packs, service some of the cells, issue an advisory message on use of the battery pack, notify a service manager of the state of the battery pack, or some combination thereof.

8. The computer-implemented method of any preceding clause, wherein a cloud-based computing system extracts one or more features from the data to train the machine learning model.

9. The computer-implemented method of any preceding clause, real-time data is received at the processing device of the vehicle and the hybrid model predicts the remaining useful life in real-time based at least on the real-time data.

10. The computer-implemented method of any preceding clause, wherein the computing device is associated with a user.

11. The computer-implemented method of any preceding clause, further comprising auto-calibrating the hybrid model based on a trigger event occurring.

12. The computer-implemented method of any preceding clause, wherein the trigger event comprises a physics-based model estimated terminal voltage exceeding an actual voltage of the battery pack by a threshold.

13. A non-transitory, tangible computer-readable medium storing instructions that, when executed, cause a processing device to:

receive data pertaining to a battery pack of a vehicle, wherein the data is received from one or more sensors associated with the vehicle, and the data pertains to a battery pack current, a cell voltage, a cell current, a cell temperature, or some combination thereof;

receive second data pertaining to simulation of the battery pack when sensor data is missing;

receive third data pertaining to the battery pack from a manufacturer of the battery pack;

receive fourth data pertaining to lab experiments data associated with the battery pack;

receive historical data on a fleet of vehicles that use the battery pack;

predict, based on the first, second, third, fourth, and historical data, a remaining useful life of each cell of the battery pack of the vehicle by using a hybrid model, wherein the hybrid model comprises:

a physics-based model configured to receive the data, and to generate one or more properties pertaining to the battery pack of the vehicle;

a machine learning model configured to use at least the one or more properties to predict the remaining useful life of each cell of the battery pack; and transmit the remaining useful life of each cell of the battery pack for presentation on a user interface of a computing device or to be further processed by another computer device.

14. The non-transitory, tangible computer-readable medium of any preceding clause, wherein the data further comprises a user battery usage profile comprising at least one of information pertaining to acceleration, braking, mileage in a given time period, frequency of battery pack charging, type of battery pack charging and speed.

15. The non-transitory, tangible computer-readable medium of any preceding clause, wherein the one or more properties comprise an internal state of the cells and battery pack including over-potentials related to an electrode, a loss of cyclable lithium, a loss of active material, a change in solid electrolyte interphase thickness, a state of health, a capacity loss, a resistance increase due to degradation, or some combination thereof.

16. The non-transitory, tangible computer-readable medium of any preceding clause, wherein the processing device is further configured to transmit the remaining useful life of each cell of the battery pack as a number of full cycles left and/or number of days left to be used before the battery pack reaches an end of life state.

17. The non-transitory, tangible computer-readable medium of any preceding clause, wherein the processing device is further configured to receive the machine learning model from a cloud-based computing system.

18. The non-transitory, tangible computer-readable medium of any preceding clause, wherein a cloud-based computing system trains a number of machine learning models by optimizing one or more hyper-parameters in an iterative process and transmits the machine learning model to the processing device of the vehicle prior to the data being received to predict the remaining useful life of each cell of the battery pack.

19. A system comprising:
   a memory device storing instructions; and
   a processing device communicatively coupled to the memory device, wherein the processing device executes the instructions to:
   receive data pertaining to a battery pack of a vehicle, wherein the data is received from one or more sensors associated with the vehicle, and the data pertains to a battery pack current, a cell current, a cell voltage, a cell temperature, or some combination thereof;
   receive second data pertaining to simulation of the battery pack when sensor data is missing;
   receive third data pertaining to the battery pack from a manufacturer of the battery pack;
   receive fourth data pertaining to lab experiments data associated with the battery pack;
   receive historical data on a fleet of vehicles that use the battery pack;
   predict, based on the first, second, third, fourth, and historical data, a remaining useful life of each cell of the battery pack of the vehicle by using a hybrid model, wherein the hybrid model comprises:
   a physics-based model configured to receive the data, and to generate one or more properties pertaining to the battery pack of the vehicle;
   a machine learning model configured to use at least the one or more properties to predict the remaining useful life of each cell of the battery pack; and
   transmit the remaining useful life of each cell of the battery pack for presentation on a user interface of a computing device.

20. The system of any preceding clause, wherein the data further comprises a user battery usage profile including information comprising at least one of acceleration, braking, mileage in a given time period, frequency of battery pack charging, type of battery pack charging, and speed.

21. A computer-implemented method comprising:
   receiving, from a cloud-based computing system, one or more machine learning model parameters that are configured to enable predicting a remaining useful life of each cell of a battery pack of a vehicle;
   loading, into memory of a processing device at the vehicle, the one or more machine learning model parameters;
   receiving data comprising one or more measurements and one or more user battery usage profiles; and
   based on the data, executing a trained machine learning model with the one or more parameters to input the data and to output and/or to transmit the remaining useful life of each cell of the battery pack.

22. The computer-implemented method of any preceding clause, wherein the data comprises data determined by a physics-based model that uses thermal single particle model with electrolyte or determined by another physics-based model.

23. The computer-implemented method of any preceding clause, wherein the cloud-based computing system preprocesses the data to transform the data from a first format to a second format that is compatible with the trained machine learning model.

24. The computer-implemented method of any preceding clause, wherein the cloud-based computing system:
   extracts one or more labels from the data; and uses the one or more labels during training of the machine learning model to predict the remaining useful life.

25. The computer-implemented method of any preceding clause, further comprising calibrating the physics-based model based on a trigger event, wherein the trigger event comprises determining when a physics-based model estimated terminal voltage exceeds an actual voltage of the battery.

26. The computer-implemented method of any preceding clause, further comprising causing presentation, on a user interface, the remaining useful life of each cell of the battery and/or transmitting to a computing device, via an application programming interface, the remaining useful life of each cell of the battery.

27. The computer-implemented method of any preceding clause, further comprising, based on the remaining useful life, performing a preventative action, wherein the preventative action comprises causing an operating parameter of the vehicle to change to consume less charge of the battery and/or signaling user interface and/or computing device to perform a preventative action including changing one or more cells in a pack of batteries or provide a service flag.

28. A tangible, non-transitory computer-readable medium storing instructions that, when executed, cause a processing device to:
   receive, from a cloud-based computing system, one or more machine learning model parameters that are configured to enable predicting a remaining useful life of each cell of a battery pack of a vehicle;
   load, into memory of a processing device at the vehicle, the one or more machine learning model and its parameters;
   receive data comprising one or more measurements and one or more user battery usage profile classifications; and
   based on the data, execute a trained machine learning model with the one or more parameters to input the data and to output the remaining useful life of each cell of the battery.

29. The non-transitory computer-readable medium of any preceding clause, wherein the data comprises data determined by a physics-based model that uses thermal single particle model with electrolyte or another physics-based model.

30. The non-transitory computer-readable medium of any preceding clause, wherein the cloud-based computing system preprocesses the data to transform the data from a first format to a second format that is compatible with the trained machine learning model.

31. The non-transitory computer-readable medium of any preceding clause, wherein the cloud-based computing system:
   extracts one or more labels from the data; and
   uses the one or more labels during training of the machine learning model to predict the remaining useful life.

32. The non-transitory computer-readable medium of any preceding clause, wherein the processing device is further to calibrate the physics-based model based on a trigger event, wherein the trigger event comprises determining when a physics-based model estimated terminal voltage exceeds an actual voltage of the battery pack.

33. The non-transitory computer-readable medium of any preceding clause, further comprising causing presentation, on a user interface, the remaining useful life of each cell of the battery and/or transmitting to a computing device, via an application programming interface, the remaining useful life of each cell of the battery.

34. The non-transitory computer-readable medium of any preceding clause, wherein the processing device is further to, based on the remaining useful life, perform a preventative action, wherein the preventative action comprises causing an operating parameter of the vehicle to change to consume less charge of the battery and/or signaling user interface and/or computing device to perform a preventative action including changing one or more cells in a pack of batteries or provide a service flag.

35. A system comprising:
   a memory device storing instructions;
   a processing device communicatively coupled to the memory device, wherein the processing device executes the instructions to:
      receive, from a cloud-based computing system, one or more machine learning model parameters that are configured to enable predicting a remaining useful life of each cell of a battery pack of a vehicle;
      load, into memory of a processing device at the vehicle, the one or more machine learning model parameters;
      receive data comprising one or more measurements and one or more user battery usage profile classifications; and
      based on the data, execute a trained machine learning model with the one or more parameters to input the data and to output the remaining useful life of each cell of the battery.

36. The system of any preceding clause, wherein the data comprises data determined by a physics-based model that uses thermal single particle model with electrolyte or another physics-based model.

37. The system of any preceding clause, wherein the cloud-based computing system preprocesses the data to transform the data from a first format to a second format that is compatible with the trained machine learning model.

38. The system of any preceding clause, wherein the cloud-based computing system:
   extracts one or more labels from the data; and
   uses the one or more labels during training of the machine learning model to predict the remaining useful life.

39. The system of any preceding clause, wherein the processing device is further to calibrate the physics-based model based on a trigger event, wherein the trigger event comprises determining when a physics-based model estimated terminal voltage exceeds an actual voltage of the battery.

40. The system of any preceding clause, further comprising causing presentation, on a user interface, the remaining useful life of each cell of the battery pack and/or transmitting to a computing device, via an application programming interface, the remaining useful life of each cell of the battery pack.

41. A computer-implemented method for a cloud-based computing system, wherein the computer-implemented method comprises:
   receiving data pertaining to a battery pack of a vehicle, wherein the data is measured by one or more sensors associated with the vehicle;

determining, based on the data, whether a sum of a physics-based model estimated terminal voltage minus an actual voltage of the battery pack satisfies a threshold; and
   responsive to determining the threshold is satisfied, determining a trigger event has occurred and calibrate one or more parameters of the physics-based model, a machine learning model, or both, wherein the physics-based model outputs one or more properties pertaining to the battery pack of the vehicle, and the machine learning model uses the one or more properties to predict a remaining useful life of each cell of the battery pack.

42. The computer-implemented method of any preceding clause, further comprising training the machine learning model in the cloud-based computing system using at least information from a cell manufacturer of the battery pack and a user battery pack usage profile.

43. The computer-implemented method of any preceding clause, further comprising using a thermal single particle model with electrolyte algorithm for the physics-based model.

44. The computer-implemented method of any preceding clause, wherein the physics-based model is configured to output at least one of a time, a cell voltage, a current, a charge throughput, and an average solid electrolyte interphase thickness.

45. The computer-implemented method of any preceding clause, wherein the output is fed as input into a physics edge model with a temperature of the battery pack, a current of the battery pack, and an initial state of charge of the battery pack.

46. The computer-implemented method of any preceding clause, further comprising using, in the machine learning model, the data from the one or more sensors to predict the remaining useful life of each cell of the battery pack.

47. The computer-implemented method of any preceding clause, further comprising extracting one or more features from the data, lab experiment data, user battery usage profile data, or some combination thereof to predict the remaining useful life of each cell of the battery.

48. A tangible, non-transitory computer-readable medium storing instructions that, when executed, cause a processing device to:
   receive data pertaining to a battery pack of a vehicle, wherein the data is measured by one or more sensors associated with the vehicle;
   determine, based on the data, whether a sum of a physics-based model estimated terminal voltage minus an actual voltage of the battery pack satisfies a threshold; and
   responsive to determining the threshold is satisfied, determine a trigger event has occurred and calibrate one or more parameters of the physics-based model, a machine learning model, or both, wherein the physics-based model outputs one or more properties pertaining to the battery pack of the vehicle, and the machine learning model uses the one or more properties to predict a remaining useful life of each cell of the battery pack.

49. The non-transitory computer-readable medium of any preceding clause, wherein the processing device is further to train the machine learning model in the cloud-based computing system using at least information from a cell manufacturer of the battery pack and a user battery pack usage profile.

50. The non-transitory computer-readable medium of any preceding clause, wherein the processing device is further to use a thermal single particle model with electrolyte algorithm for the physics-based model.

51. The non-transitory computer-readable medium of any preceding clause, wherein the physics-based model is configured to output at least one of a time, a cell voltage, a current, a charge throughput, and an average solid electrolyte interphase thickness.

52. The non-transitory computer-readable medium of any preceding clause, wherein the output is fed as input into a physics edge model with a temperature of the battery a current of the battery pack, and an initial state of charge of the battery pack.

53. The non-transitory computer-readable medium of any preceding clause, wherein the processing device is further to use, in the machine learning model, the data from the one or more sensors to predict the remaining useful life of each cell of the battery pack.

54. The non-transitory computer-readable medium of any preceding clause, wherein the processing device is further to extract one or more features from the data, lab experiment data, simulation data, user battery usage profile data, or some combination thereof to predict the remaining useful life of each cell of the battery pack.

55. A system comprising:
a memory device storing instructions; and
a processing device communicatively coupled to the memory device, wherein the processing device executes the instructions to:
receive data pertaining to a battery pack of a vehicle, wherein the data is measured by one or more sensors associated with the vehicle;
determine, based on the data, whether a sum of a physics-based model estimated terminal voltage minus an actual voltage of the battery pack satisfies a threshold; and
responsive to determining the threshold is satisfied, determine a trigger event has occurred and calibrate one or more parameters of the physics-based model, a machine learning model, or both, wherein the physics-based model outputs one or more properties pertaining to the battery pack of the vehicle, and the machine learning model uses the one or more properties to predict a remaining useful life of each cell of the battery pack.

56. The system of any preceding clause, wherein the processing device is further to train the machine learning model in the cloud-based computing system using at least information from a cell manufacturer of the battery pack and a user battery pack usage profile.

57. The system of any preceding clause, wherein the processing device is further to use a thermal single particle model with electrolyte algorithm for the physics-based model or another physics-based model.

58. The system of any preceding clause, wherein the physics-based model is configured to output at least one of a time, a cell voltage, a current, a charge throughput, and an average solid electrolyte interphase thickness.

59. The system of any preceding clause, wherein the output is fed as input into a physics edge model with a temperature of the battery a current of the battery pack, and an initial state of charge of the battery pack.

60. The system of any preceding clause, wherein the processing device is further to use, in the machine learning model, the data from the one or more sensors to predict the remaining useful life of each cell of the battery pack.

61. A computer-implemented method for a cloud-based computing system, wherein the computer-implemented method comprises:
training, using test data, one or more machine learning models to predict a remaining useful life of each cell of a battery pack of a vehicle;
using a rule-based evaluator to determine a plurality of first scores for the one or more machine learning models;
using a machine learning based metric evaluator to determine a plurality of second scores for the one or more machine learning models;
using a model selection inference engine to select, based on the first and second scores for the one or more machine learning models, a machine learning model to use to predict the remaining useful life of each cell of the battery pack of the vehicle; and
transmitting, to a processing device of the vehicle, the selected machine learning model and parameters to predict the remaining useful life of each cell of the battery pack of the vehicle.

62. The computer-implemented method of any preceding clause, further comprising receiving data from one or more sensors of the vehicle in real-time or near real-time and predicting, using the data, the remaining useful life of each cell of the battery pack of the vehicle, wherein supplemental simulation data is used when sensor data is not available and the data is augmented further with manufacturer supplied data.

63. The computer-implemented method of any preceding clause, further comprising causing the remaining useful life of each cell of the battery pack to be presented as a scalar value on a user interface, issuing a service message to service one or more cells in the battery pack,
transmitting the same to a computing device that will merge results from a number of battery packs collected over time to draw advisory notes on improving battery design, or some combination thereof.

64. The computer-implemented method of any preceding clause, further comprising, based on the remaining useful life, performing a preventative action, wherein the preventative action comprises causing an operating parameter of the vehicle to change to consume less charge of the battery, changing some cells or advisory messages on driving, or some combination thereof.

65. The computer-implemented method of any preceding clause, further comprising auto-calibrating the one or more machine learning models when a trigger event occurs.

66. The computer-implemented method of any preceding clause, wherein the processing device of the vehicle executes the selected machine learning model with real-time or near real-time sensor data.

67. The computer-implemented method of any preceding clause, further comprising using a physics-based model to determine one or more properties of the battery pack and inputting the one or more properties of the battery pack into the selected machine learning model to predict the remaining useful life of each cell of the battery of the vehicle.

68. A tangible, non-transitory computer-readable medium storing instructions that, when executed, cause a processing device to:

train, using test data, one or more machine learning models to predict a remaining useful life of each cell of a battery pack of a vehicle;

use a rule-based evaluator to determine a plurality of first scores for the one or more machine learning models;

use a machine learning based metric evaluator to determine a plurality of second scores for the one or more machine learning models;

use a model selection inference engine to select, based on the first and second scores for the one or more machine learning models, a machine learning model to use to predict the remaining useful life of each cell of the battery pack of the vehicle; and transmit, to a processing device of the vehicle, the selected machine learning model and parameters to predict the remaining useful life of each cell of the battery pack of the vehicle.

69. The non-transitory computer-readable medium of any preceding clause, wherein the processing device is further to receive data from one or more sensors of the vehicle in real-time or near real-time and predicting, using the data, the remaining useful life of each cell of the battery pack of the vehicle, wherein supplemental simulation data is used when sensor data is not available and the data is augmented further with manufacturer supplied data.

70. The non-transitory computer-readable medium of any preceding clause, wherein the processing device is further to cause the remaining useful life of each cell of the battery pack to be presented as a scalar value on a user interface, transmit a service message to service one or more cells in the battery pack, transmit the same to a computing device that will merges results from a number of battery packs collected over time to draw advisory notes on improving battery design, or some combination thereof.

71. The non-transitory computer-readable medium of any preceding clause, wherein the processing device is further to, based on the remaining useful life, perform a preventative action, wherein the preventative action comprises causing an operating parameter of the vehicle to change to consume less charge of the battery, changing some cells or advisory messages on driving, or some combination thereof.

72. The non-transitory computer-readable medium of any preceding clause, wherein the processing device is further to auto-calibrate the one or more machine learning models when a trigger event occurs.

73. The non-transitory computer-readable medium of any preceding clause, wherein the processing device of the vehicle executes the selected machine learning model with real-time or near real-time sensor data.

74. The non-transitory computer-readable medium of any preceding clause, wherein the processing device is further to use a physics-based model to determine one or more properties of the battery pack and inputting the one or more properties of the battery pack into the selected machine learning model to predict the remaining useful life of each cell of the battery of the vehicle.

75. A system comprising:

a memory device storing instructions; and a processing device communicatively coupled to the memory device, wherein the processing device executes the instructions to:

train, using test data, one or more machine learning models to predict a remaining useful life of each cell of a battery pack of a vehicle;

use a rule-based evaluator to determine a plurality of first scores for the one or more machine learning models;

use a machine learning based metric evaluator to determine a plurality of second scores for the one or more machine learning models;

use a model selection inference engine to select, based on the first and second scores for the one or more machine learning models, a machine learning model to use to predict the remaining useful life of each cell of the battery pack of the vehicle; and transmit, to a processing device of the vehicle, the selected machine learning model and parameters to predict the remaining useful life of each cell of the battery pack of the vehicle.

76. The system of any preceding clause, wherein the processing device is further to receive data from one or more sensors of the vehicle in real-time or near real-time and predicting, using the data, the remaining useful life of each cell of the battery pack of the vehicle, wherein supplemental simulation data is used when sensor data is not available and the data is augmented further with manufacturer supplied data.

77. The system of any preceding clause, wherein the processing device is further to cause the remaining useful life of each cell of the battery pack to be presented as a scalar value on a user interface, transmit a service message to service one or more cells in the battery pack, transmit the same to a computing device that will merges results from a number of battery packs collected over time to draw advisory notes on improving battery design, or some combination thereof.

78. The system of any preceding clause, wherein the processing device is further to, based on the remaining useful life, perform a preventative action, wherein the preventative action comprises causing an operating parameter of the vehicle to change to consume less charge of the battery, changing some cells or advisory messages on driving, or some combination thereof.

79. The system of any preceding clause, wherein the processing device is further to auto-calibrate the one or more machine learning models when a trigger event occurs.

80. The system of any preceding clause, wherein the processing device of the vehicle executes the selected machine learning model with real-time or near real-time sensor data.

What is claimed is:

1. A computer-implemented method for a processing device included in a vehicle, wherein the computer-implemented method comprises:

receiving first data pertaining to a battery pack of the vehicle, wherein the first data is received from one or more sensors associated with the vehicle, and the first data pertains to a battery pack current, a cell voltage, a cell current, a cell temperature, or some combination thereof;

predicting, based on at least the first data, a remaining useful life of each cell of the battery pack of the vehicle by using a hybrid model, wherein the remaining useful life represents one or more battery characteristics that satisfy a failure or replacement threshold, and wherein the hybrid model comprises:

a physics-based model configured to receive at least the first data, and to generate one or more properties pertaining to the battery pack of the vehicle;

a machine learning model that receives the one or more properties from the physics-based model and that is trained to use at least the one or more properties to predict the remaining useful life of at least one cell of the battery pack, wherein the machine learning model is selected from a plurality of machine learning models by executing a rules-based evaluator that determines a plurality of scores for the plurality of machine learning models and executing a model selection inference engine that selects, based on the plurality of scores, the machine learning model; and transmitting the remaining useful life of at least one cell of the battery pack for presentation on a user interface of a computing device.

2. The computer-implemented method of claim 1, further comprising:

receiving other data comprising a user battery usage profile including information comprising at least one of acceleration, deceleration, braking, mileage in a given time period, frequency of charging the battery pack, type of battery pack charging, and speed; and using the other data to predict the remaining useful life of the at least one cell of the battery pack.

3. The computer-implemented method of claim 1, wherein the one or more properties comprise an internal state of the battery pack including over-potentials related to an electrode, a loss of cyclable lithium, a loss of active material, a change in solid electrolyte interphase thickness, a state of health, a capacity loss, a resistance increase due to degradation, or some combination thereof.

4. The computer-implemented method of claim 1, further comprising transmitting the remaining useful life of at least one cell of the battery pack as a number of full cycles left to be used before the battery pack reaches an end of life state.

5. The computer-implemented method of claim 1, further comprising receiving the machine learning model and its parameters from a cloud-based computing system.

6. The computer-implemented method of claim 1, wherein a cloud-based computing system trains the machine learning model by optimizing one or more hyper-parameters in an iterative process and transmits machine learning model parameters to the processing device of the vehicle prior to the data being received to predict the remaining useful life of at least one cell of the battery pack.

7. The computer-implemented method of claim 1, further comprising, based on the remaining useful life, performing a preventative action, wherein the preventative action comprises causing an operating parameter of the vehicle to change to consume less charge of the battery pack, change an operating parameter to update a charging profile, change cells in some battery packs, service some of the cells, issue an advisory message on use of the battery pack, notify a service manager of the state of the battery pack, or some combination thereof.

8. The computer-implemented method of claim 1, wherein a cloud-based computing system extracts one or more features from the first data to train the machine learning model.

9. The computer-implemented method of claim 1, wherein real-time data is received at the processing device of the vehicle and the hybrid model predicts the remaining useful life in real-time based at least on the real-time data.

10. The computer-implemented method of claim 1, wherein the computing device is associated with a user.

11. The computer-implemented method of claim 1, further comprising auto-calibrating the hybrid model based on a trigger event occurring.

12. The computer-implemented method of claim 11, wherein the trigger event comprises a physics-based model estimated terminal voltage exceeding an actual voltage of the battery pack by a threshold.

13. A non-transitory, tangible computer-readable medium storing instructions that, when executed, cause a processing device to:

receive first data pertaining to a battery pack of a vehicle, wherein the first data is received from one or more sensors associated with the vehicle, and the first data pertains to a battery pack current, a cell voltage, a cell current, a cell temperature, or some combination thereof;

predict, based on at least the first data, a remaining useful life of each cell of the battery pack of the vehicle by using a hybrid model, wherein the remaining useful life represents one or more battery characteristics that satisfy a failure or replacement threshold, and wherein the hybrid model comprises:

a physics-based model configured to receive at least the first data, and to generate one or more properties pertaining to the battery pack of the vehicle;

a machine learning model that receives the one or more properties from the physics-based model and that is trained to use at least the one or more properties to predict the remaining useful life of at least one cell of the battery pack, wherein the machine learning model is selected from a plurality of machine learning models by executing a rules-based evaluator that determines a plurality of scores for the plurality of machine learning models and executing a model selection inference engine that selects, based on the plurality of scores, the machine learning model; and transmit the remaining useful life of at least one cell of the battery pack for presentation on a user interface of a computing device.

14. The non-transitory, tangible computer-readable medium of claim 13, wherein the first data further comprises a user battery usage profile including information comprising at least one of acceleration, braking, mileage in a given time period, frequency of battery pack charging, type of battery pack charging, and speed.

15. The non-transitory, tangible computer-readable medium of claim 13, wherein the one or more properties comprise an internal state of the cells and battery pack including over-potentials related to an electrode, a loss of cyclable lithium, a loss of active material, a change in solid electrolyte interphase thickness, a state of health, a capacity loss, a resistance increase due to degradation, or some combination thereof.

16. The non-transitory, tangible computer-readable medium of claim 13, wherein the processing device is further configured to transmit the remaining useful life of at least one cell of the battery pack as a number of full cycles left and/or number of days left to be used before the battery pack reaches an end of life state.

17. The non-transitory, tangible computer-readable medium of claim 13, wherein the processing device is further configured to receive the machine learning model from a cloud-based computing system.

18. The non-transitory, tangible computer-readable medium of claim 13, wherein a cloud-based computing system trains a number of machine learning models by optimizing one or more hyper-parameters in an iterative process and transmits the machine learning model to the processing device of the vehicle prior to the data being received to predict the remaining useful life of each cell of the battery pack.

19. A system comprising:

a memory device storing instructions; and a processing device communicatively coupled to the memory device, wherein the processing device executes the instructions to:

receive first data pertaining to a battery pack of a vehicle, wherein the first data is received from one or more sensors associated with the vehicle, and the first data pertains to a battery pack current, a cell voltage, a cell current, a cell temperature, or some combination thereof;

predict, based on at least the first data, a remaining useful life of each cell of the battery pack of the vehicle by using a hybrid model, wherein the remaining useful life represents one or more battery characteristics that satisfy a failure or replacement threshold, and wherein the hybrid model comprises:

a physics-based model configured to receive at least the first data, and to generate one or more properties pertaining to the battery pack of the vehicle;

a machine learning model that receives the one or more properties from the physics-based model and that is trained to use at least the one or more properties to predict the remaining useful life of at least one cell of the battery pack, wherein the machine learning model is selected from a plurality of machine learning models by executing a rules-based evaluator that determines a plurality of scores for the plurality of machine learning models and executing a model selection inference engine that selects, based on the plurality of scores, the machine learning model; and transmit the remaining useful life of at least one cell of the battery pack for presentation on a user interface of a computing device.

20. The system of claim 19, wherein the first data further comprises a user battery usage profile including information comprising at least one of acceleration, braking, mileage in a given time period, frequency of battery pack charging, type of battery pack charging, and speed.

\* \* \* \* \*